(12) United States Patent
Miller

(10) Patent No.: US 11,073,702 B2
(45) Date of Patent: Jul. 27, 2021

(54) CAMERA LENS SUSPENSION WITH LIMITER

(71) Applicant: Hutchinson Technology Incorporated, Hutchinson, MN (US)

(72) Inventor: Mark A. Miller, Hutchinson, MN (US)

(73) Assignee: Hutchinson Technology Incorporated, Hutchinson, MN (US)

( * ) Notice: Subject to any disclaimer, the term of this patent is extended or adjusted under 35 U.S.C. 154(b) by 0 days.

(21) Appl. No.: 16/200,570

(22) Filed: Nov. 26, 2018

(65) Prior Publication Data

US 2019/0162982 A1 May 30, 2019

Related U.S. Application Data

(63) Continuation of application No. 15/156,545, filed on May 17, 2016, now Pat. No. 10,139,647, which is a
(Continued)

(51) Int. Cl.
*G02B 27/64* (2006.01)
*F16M 13/02* (2006.01)
(Continued)

(52) U.S. Cl.
CPC ............ *G02B 27/646* (2013.01); *F16F 1/027* (2013.01); *F16F 15/005* (2013.01);
(Continued)

(58) Field of Classification Search
None
See application file for complete search history.

(56) References Cited

U.S. PATENT DOCUMENTS

| 3,587,432 A | 6/1971 | Koch |
| 3,734,386 A | 5/1973 | Hazel |

(Continued)

FOREIGN PATENT DOCUMENTS

| CN | 1764239 A | 4/2006 |
| CN | 100410690 C | 8/2008 |

(Continued)

OTHER PUBLICATIONS

Communication pursuant to Article 94(3) EPC in European Application No. 16762309.9, dated Apr. 4, 2019.
(Continued)

*Primary Examiner* — Derek S. Chapel
(74) *Attorney, Agent, or Firm* — DLA Piper LLP (US)

(57) ABSTRACT

A suspension assembly for a camera lens element includes a support member with a wire attach structure and a moving member coupled to the support member. The moving member includes a plate, flexure arms extending from the plate and coupled to the support member, and a wire attach structure. A bearing supports the plate of the moving member for movement with respect to the support member. A shape memory alloy wire is coupled to and extends between the wire attach structures of the support member and the moving member. The limiter limits a range of movement of the moving member with respect to the support member, and in embodiments includes an opening in one of the moving member plate and the support member, and a stop that includes an engagement portion extending into the opening in the other of the moving member plate and the support member. The opening has a first diameter, and the engagement portion has a second diameter that is less than the first diameter.

20 Claims, 31 Drawing Sheets

Related U.S. Application Data continuation of application No. 14/951,051, filed on Nov. 24, 2015, now Pat. No. 9,366,879.

(60) Provisional application No. 62/129,562, filed on Mar. 6, 2015, provisional application No. 62/086,595, filed on Dec. 2, 2014.

(51) Int. Cl.

| | | |
|---|---|---|
| *G02B 7/08* | (2021.01) | |
| *F16F 15/00* | (2006.01) | |
| *G02B 7/02* | (2021.01) | |
| *G02B 7/09* | (2021.01) | |
| *F16F 1/02* | (2006.01) | |
| *H05K 7/14* | (2006.01) | |
| *H05K 1/02* | (2006.01) | |

(52) U.S. Cl.
CPC ............. *F16M 13/022* (2013.01); *G02B 7/02* (2013.01); *G02B 7/023* (2013.01); *G02B 7/08* (2013.01); *G02B 7/09* (2013.01); *H05K 7/1417* (2013.01); *H05K 7/1422* (2013.01); *H05K 1/028* (2013.01)

(56) References Cited

U.S. PATENT DOCUMENTS

| | | | |
|---|---|---|---|
| 3,776,447 A | 12/1973 | Simmons et al. | |
| 4,140,265 A | 2/1979 | Morino | |
| 4,437,603 A | 3/1984 | Kobayashi et al. | |
| 4,781,319 A | 11/1988 | Deubzer et al. | |
| 4,984,581 A | 1/1991 | Stice | |
| 5,269,810 A | 12/1993 | Hull et al. | |
| 5,477,463 A | 12/1995 | Tamura | |
| 5,513,917 A | 5/1996 | Ide et al. | |
| 5,831,820 A | 11/1998 | Huang | |
| 5,840,417 A | 11/1998 | Bolger | |
| 6,149,742 A | 11/2000 | Carpenter et al. | |
| 6,279,215 B1 | 8/2001 | Nomoto | |
| 6,916,115 B1 | 7/2005 | Valiance et al. | |
| 7,384,531 B1 | 6/2008 | Peltoma et al. | |
| 7,388,733 B2 | 6/2008 | Swanson et al. | |
| 7,679,647 B2 | 3/2010 | Stavely et al. | |
| 7,929,252 B1 | 4/2011 | Hentges et al. | |
| 8,144,430 B2 | 3/2012 | Hentges et al. | |
| 8,169,746 B1 | 5/2012 | Rice et al. | |
| 8,175,449 B2 | 5/2012 | Kubo et al. | |
| 8,218,958 B2 | 7/2012 | Sato | |
| 8,350,959 B2 | 1/2013 | Topliss et al. | |
| 8,388,773 B2 | 3/2013 | Luntz et al. | |
| 8,421,908 B2 | 4/2013 | Kosaka et al. | |
| 8,570,384 B2 | 10/2013 | Brown | |
| 8,602,665 B2 | 12/2013 | Kamatani et al. | |
| 8,848,064 B2 | 9/2014 | Topliss et al. | |
| 8,885,299 B1 | 11/2014 | Bennin et al. | |
| 9,175,671 B2 | 11/2015 | Howarth | |
| 9,366,879 B1 | 6/2016 | Miller | |
| 9,454,016 B1 | 9/2016 | Ladwig et al. | |
| 9,479,699 B2 | 10/2016 | Brown et al. | |
| 9,541,769 B2 | 1/2017 | Ladwig et al. | |
| 10,036,897 B2 | 7/2018 | Ladwig et al. | |
| 10,067,357 B2 | 9/2018 | Ladwig et al. | |
| 10,139,647 B2 | 11/2018 | Miller | |
| 10,670,878 B2 | 6/2020 | Miller et al. | |
| 10,775,638 B2 | 9/2020 | Miller et al. | |
| 2004/0036479 A1 | 2/2004 | Thomsen | |
| 2004/0093610 A1 | 5/2004 | Suzuki et al. | |
| 2005/0115235 A1 | 6/2005 | Mernoe | |
| 2005/0190683 A1 | 9/2005 | Ando | |
| 2008/0183257 A1 | 7/2008 | Imran et al. | |
| 2008/0231955 A1 | 9/2008 | Otsuka | |
| 2009/0295986 A1 | 12/2009 | Topliss et al. | |
| 2010/0074607 A1 | 3/2010 | Topliss et al. | |
| 2010/0074608 A1 | 3/2010 | Topliss | |
| 2010/0119863 A1 | 5/2010 | Bogursky et al. | |
| 2011/0249131 A1 | 10/2011 | Topliss et al. | |
| 2012/0151913 A1 | 6/2012 | Foshansky | |
| 2012/0154614 A1 | 6/2012 | Moriya et al. | |
| 2012/0174574 A1 | 7/2012 | Kotanagi et al. | |
| 2013/0016427 A1 | 1/2013 | Sugawara | |
| 2013/0169092 A1 | 7/2013 | Neuhaus et al. | |
| 2013/0221071 A1 | 8/2013 | Kim et al. | |
| 2013/0222685 A1 | 8/2013 | Topliss et al. | |
| 2013/0292856 A1 | 11/2013 | Braun et al. | |
| 2013/0300880 A1 | 11/2013 | Brown et al. | |
| 2013/0338730 A1 | 12/2013 | Shiroff et al. | |
| 2014/0055630 A1 | 2/2014 | Gregory et al. | |
| 2015/0068013 A1 | 3/2015 | Galu, Jr. | |
| 2015/0135703 A1 | 5/2015 | Eddington et al. | |
| 2015/0304561 A1 | 10/2015 | Howarth et al. | |
| 2015/0346507 A1 | 12/2015 | Howarth | |
| 2015/0365568 A1 | 12/2015 | Topliss et al. | |
| 2016/0154252 A1 | 6/2016 | Miller et al. | |
| 2016/0227088 A1 | 8/2016 | Brown et al. | |
| 2016/0258425 A1 | 9/2016 | Ladwig et al. | |
| 2016/0263889 A1 | 9/2016 | Hamaguchi et al. | |
| 2016/0294141 A1 | 10/2016 | Davis et al. | |
| 2017/0219842 A1 | 8/2017 | Howarth et al. | |
| 2017/0336646 A1 | 11/2017 | Miller et al. | |
| 2017/0357076 A1 | 12/2017 | Scheele et al. | |
| 2018/0284475 A1* | 10/2018 | Howarth ................ G03B 5/02 | |
| 2018/0321503 A1* | 11/2018 | Brown ................ G02B 27/646 | |
| 2018/0373056 A1 | 12/2018 | Ladwig et al. | |

FOREIGN PATENT DOCUMENTS

| | | |
|---|---|---|
| CN | 101246248 A | 8/2008 |
| CN | 101300831 A | 11/2008 |
| CN | 101408655 A | 4/2009 |
| CN | 101416090 A | 4/2009 |
| CN | 101668947 A | 3/2010 |
| CN | 101876742 A | 11/2010 |
| CN | 102089695 A | 6/2011 |
| CN | 102150073 A | 8/2011 |
| CN | 104956254 A | 9/2015 |
| EP | 1 870 962 A2 | 12/2007 |
| EP | 2140138 A2 | 1/2010 |
| EP | 2 732 331 A1 | 5/2014 |
| EP | 2920955 A1 | 9/2015 |
| JP | 2002-367204 A | 12/2002 |
| JP | 2003-507625 A | 2/2003 |
| JP | 2006-031026 A | 2/2006 |
| JP | 2007-092556 A | 4/2007 |
| JP | 2008-233526 A | 10/2008 |
| JP | 2009-103861 A | 5/2009 |
| JP | 2009-531729 A | 9/2009 |
| JP | 2010-128262 A | 6/2010 |
| JP | 2010-192036 A | 9/2010 |
| JP | 2011-022250 A | 2/2011 |
| JP | 2011-065140 A | 3/2011 |
| JP | 2011-107413 A | 6/2011 |
| JP | 2011-175160 A | 9/2011 |
| JP | 2012-502323 A | 1/2012 |
| JP | 2012-517611 A | 8/2012 |
| JP | 2013-178457 A | 9/2013 |
| JP | 2013-546023 A | 12/2013 |
| JP | 2015-518977 A | 7/2015 |
| JP | 2015-537247 A | 12/2015 |
| KR | 10-2009-0081855 A | 7/2009 |
| KR | 10-2015-0013017 A | 2/2015 |
| WO | WO 94/00186 A1 | 1/1994 |
| WO | WO 01/12985 A1 | 2/2001 |
| WO | WO 2008/099155 A1 | 8/2008 |
| WO | WO 2008/129291 A2 | 10/2008 |
| WO | WO 2010/004993 A1 | 1/2010 |
| WO | WO 2010/089526 A2 | 8/2010 |
| WO | WO 2012/066285 A1 | 5/2012 |
| WO | WO 2013/153400 A2 | 10/2013 |
| WO | WO 2013/175197 A1 | 11/2013 |
| WO | WO 2014/076463 A1 | 5/2014 |
| WO | WO 2014/083318 A1 | 6/2014 |

(56) References Cited

FOREIGN PATENT DOCUMENTS

WO    WO 2015/132571 A1    9/2015
WO    WO 2016/009200 A1    1/2016

OTHER PUBLICATIONS

Office Action in Chinese Application No. 201580065890.7, dated Mar. 27, 2019.
Office Action in Chinese Application No. 201580065775.X, dated Mar. 27, 2019.
Office Action in Chinese Application No. 201580065332.0, dated Mar. 18, 2019.
Office Action in U.S. Appl. No. 14/956,612, dated May 31, 2019.
Office Action in U.S. Appl. No. 15/063,151, dated May 29, 2019.
Office Action in U.S. Appl. No. 15/599,449, dated Apr. 17, 2019.
International Search Report and Written Opinion in International Application No. PCT/US2015/062576, dated Mar. 2, 2016.
International Preliminary Report on Patentability in International Application No. PCT/US2015/062576, dated Jun. 15, 2017.
Extended European Search Report in European Application No. 15866032.4, dated Mar. 22, 2018.
International Search Report and Written Opinion in International Application No. PCT/US2015/062713, dated Mar. 2, 2016.
International Preliminary Report on Patentability in International Application No. PCT/US2015/062713, dated Jun. 15, 2017.
Extended European Search Report in European Application No. 15864743.8, dated Mar. 22, 2018.
International Search Report and Written Opinion in International Application No. PCT/US2015/063363, dated Feb. 12, 2016.
International Preliminary Report on Patentability in International Application No. PCT/US2015/063363, dated Jun. 15, 2017.
Extended European Search Report in European Application No. 15865383.2, dated Mar. 22, 2018.
International Search Report and Written Opinion in International Application No. PCT/US2016/021230, dated Jun. 3, 2016.
International Preliminary Report on Patentability in International Application No. PCT/US2016/021230, dated Sep. 21, 2017.
Extended European Search Report in European Application No. 16762309.9, dated Aug. 1, 2018.
Office Action in Chinese Application No. 201680025323.3, dated Dec. 28, 2018.
International Search Report and Written Opinion in International Application No. PCT/US2017/033517, dated Aug. 4, 2017.
International Preliminary Report on Patentability in International Application No. PCT/US2017/033517, dated Nov. 29, 2018.
International Search Report and Written Opinion in International Application No. PCT/US2017/036884, dated Oct. 19, 2017.
International Preliminary Report on Patentability in International Application No. PCT/US2017/036884, dated Dec. 20, 2018.
International Search Report and Written Opinion in International Application No. PCT/US2015/066939, dated Mar. 14, 2016.
International Search Report and Written Opinion in International Application No. PCT/US2016/025194, dated Jun. 30, 2016.
International Search Report and Written Opinion in International Application No. PCT/US2016/054274, dated Dec. 13, 2016.
Office Action in U.S. Appl. No. 14/956,612, dated Jan. 4, 2018.
Office Action in U.S. Appl. No. 14/956,612, dated Aug. 9, 2018.
Office Action in U.S. Appl. No. 15/063,151, dated Feb. 21, 2018.
Office Action in U.S. Appl. No. 15/063,151, dated Jul. 26, 2018.
Office Action in U.S. Appl. No. 15/156,545, dated May 8, 2017.
Office Action in U.S. Appl. No. 15/156,545, dated Dec. 26, 2017.
Notice of Allowance in U.S. Appl. No. 15/156,545, dated Jul. 26, 2018.
Office Action in U.S. Appl. No. 15/276,115, dated Sep. 18, 2017.
Notice of Allowance in U.S. Appl. No. 15/276,115, dated Mar. 26, 2018.
Corrected Notice of Allowance in U.S. Appl. No. 15/276,115, dated Jul. 3, 2018.
Office Action in U.S. Appl. No. 15/400,516, dated Sep. 21, 2017.
Office Action in U.S. Appl. No. 15/400,516, dated Dec. 15, 2017.
Notice of Allowance in U.S. Appl. No. 15/400,516, dated May 4, 2018.
Office Action in U.S. Appl. No. 15/599,449, dated Jan. 25, 2018.
Office Action in U.S. Appl. No. 15/599,449, dated Oct. 31, 2018.
Office Action in U.S. Appl. No. 15/618,917, dated Jan. 11, 2019.
Second Office Action in Chinese Application No. 201580065890.7, dated Sep. 29, 2019.
Notice of Reasons for Refusal in Japanese Patent Application No. 2017-529018 dated Jan. 7, 2020.
Second Office Action in Chinese Patent Application No. 201580065775.X, dated Dec. 25, 2019.
Notice of Reasons for Refusal in Japanese Patent Application No. 2017-529039 dated Dec. 3, 2019.
Extended European Search Report in European Application No. 19193083.3, dated Oct. 29, 2019.
Second Office Action in Chinese Patent Application No. 201580065332.0, dated Dec. 16, 2019.
Notice of Reasons for Refusal in Japanese Patent Application No. 2017-529044 dated Jan. 7, 2020.
Second Office Action in Chinese Patent Application No. 201680025323.3, dated Sep. 30, 2019.
Extended European Search Report in European Application No. 19173490.4, dated Jul. 12, 2019.
Extended European Search Report in European Patent Application No. 17800231.7, dated Dec. 9, 2019.
Extended European Search Report in European Patent Application No. 17811132.4, dated Jan. 23, 2020.
Office Action in U.S. Appl. No. 15/063,151, dated Nov. 27, 2019.
Notice of Allowance in U.S. Appl. No. 15/599,449, dated Jan. 27, 2020.
Office Action in U.S. Appl. No. 15/618,917, dated Aug. 9, 2019.
Notice of Allowance in U.S. Appl. No. 15/618,917, dated Jan. 17, 2020.
Third Office Action in Chinese Patent Application No. 201580065890.7 dated Feb. 18, 2020.
Decision to Grant for Japanese Patent Application No. 2017-529039 dated Mar. 17, 2020.
Notice of Reasons for Refusal for Japanese Patent Application No. 2017-546796 dated Mar. 31, 2020.
Notice of Decision of Refusal in Japanese Application No. 2017-546796, dated Dec. 15, 2020.
Notice of Reasons for Refusal in Japanese Application No. 2018-564209, dated Jan. 26, 2021.
Office Action in U.S. Appl. No. 15/063,151, dated Feb. 12, 2021.
Notice of Allowance in U.S. Appl. No. 16/119,619, dated Dec. 2, 2020.
Office Action in U.S. Appl. No. 15/618,917, dated Feb. 19, 2021.
Allen, K.W., "Adhesion 12," Elsevier Applied Science, 1988, p. 98.
Decision to Grant for Japanese Application No. 2017-529018, dated May 26, 2020.
Decision to Grant for Japanese Application No. 2017-529044, dated May 26, 2020.
Office Action in Chinese Application No. 201780044616.0, dated Jul. 24, 2020.
Office Action in Chinese Application No. 201780047685.7, dated Jun. 15, 2020.
Notice of Allowance in U.S. Appl. No. 14/956,612, dated May 14, 2020.
Office Action in U.S. Appl. No. 15/063,151, dated Jul. 27, 2020.
Office Action in U.S. Appl. No. 16/119,619, dated May 5, 2020.
Office Action in U.S. Appl. No. 16/119,619, dated Jul. 17, 2020.
Office Action in U.S. Appl. No. 15/618,917, dated May 21, 2020.
Office Action in U.S. Appl. No. 15/618,917, dated Oct. 6, 2020.

* cited by examiner

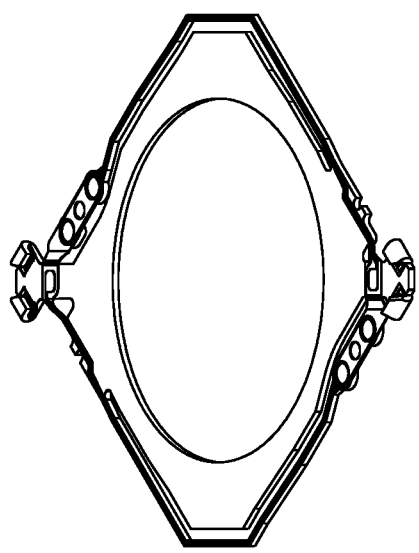
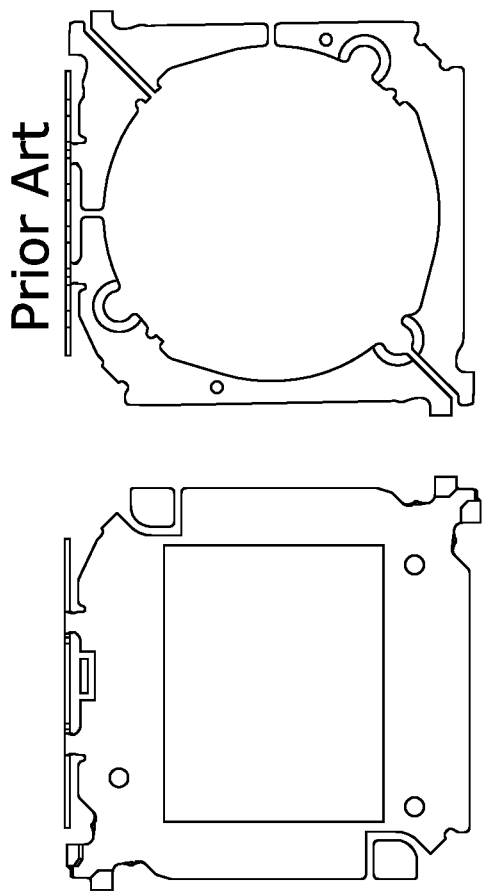
Enable integrated full hard SST (stainless steel) spring and moving crimps
- Use poly and copper to take up any spring back of full hard SST after crimp for high wire pull strength
Enable solid FPC (flexible printed circuit) SST layer
- Enables thin 2-piece welded OIS
- Enable OIS_COMMON to be FPC SST layer for strong weld connection
FIG. 12

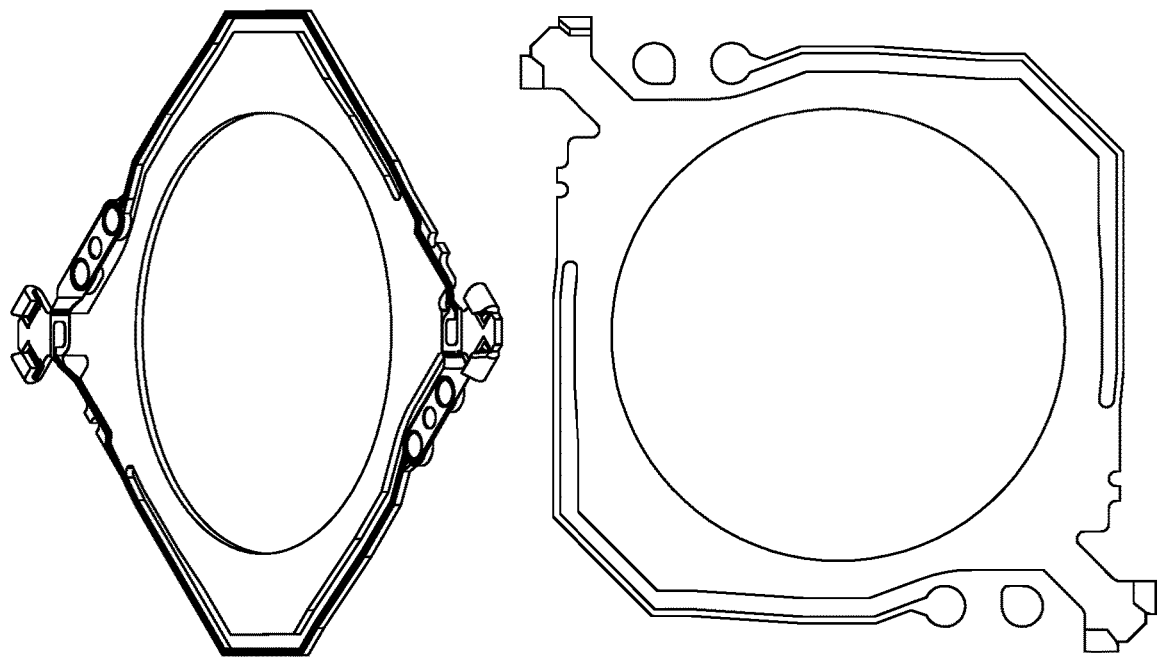
Integrated spring and crimps
- Use poly and copper to take up any spring back of full hard SST after crimp for high wire pull strength
- Poly and copper will not damage the wire like full hard metal could during the crimp process
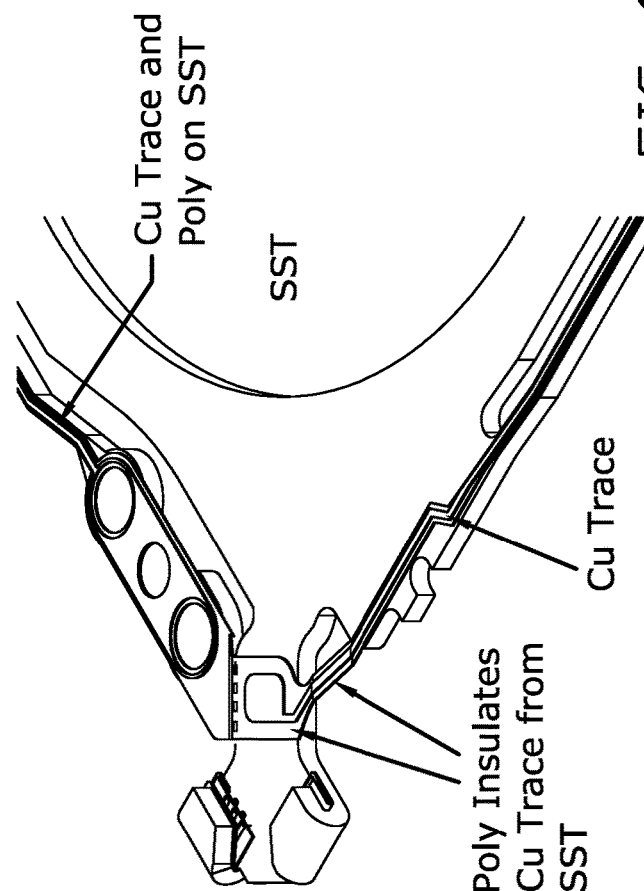
Cu Trace and Poly on SST
SST
Cu Trace
Poly Insulates Cu Trace from SST
FIG. 13

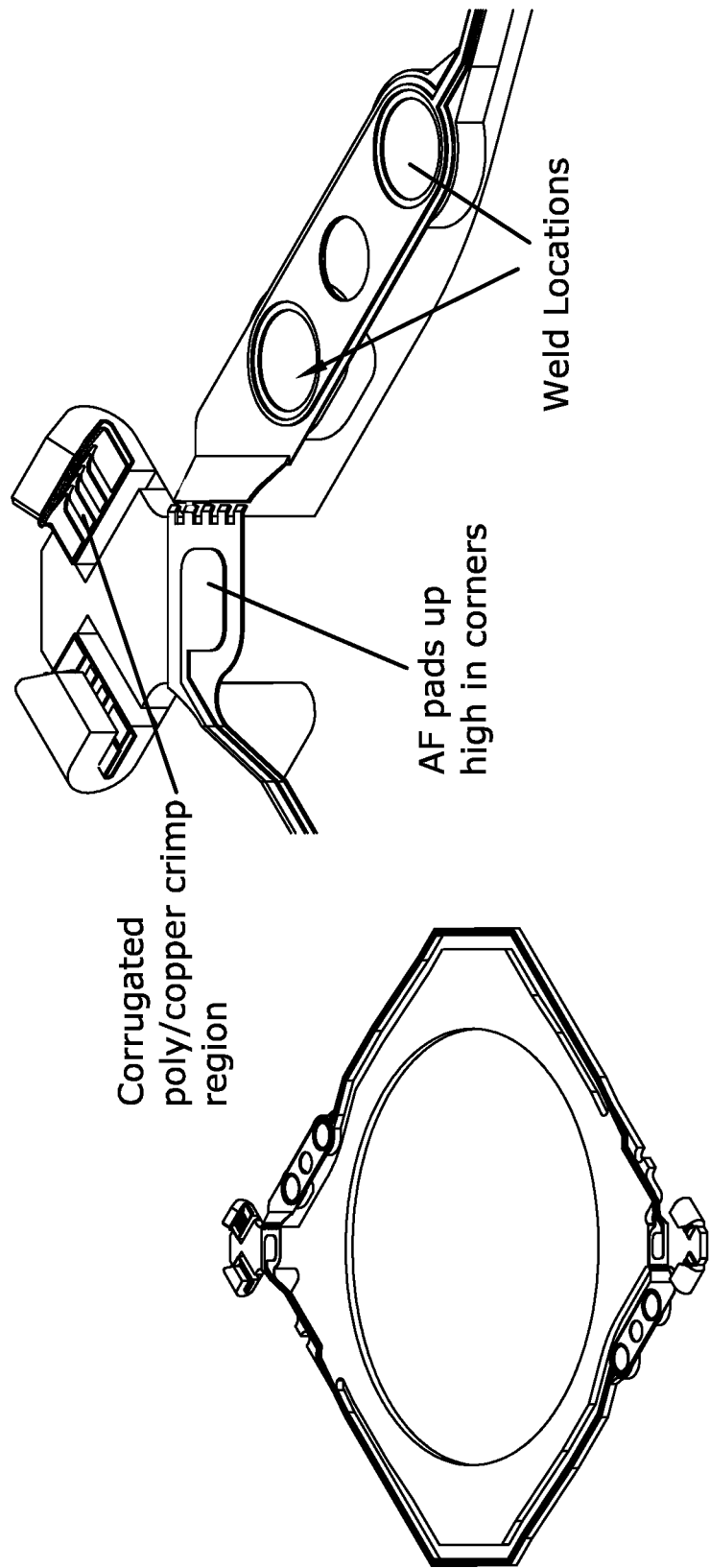

Benefits of Innovation

- Lower material cost
  - Forming dimples is much cheaper than buying small ball bearings. Approximately 10% the cost per OIS part.

- Improved assembly cost
  - Forming dimples is one simple operation on relatively simple equipment, whereas picking and placing 3 ball bearings requires many operations using expensive equipment.

- Improved reliability
  - It has proven difficult to keep the 3 small ball bearings from ejecting during internal manufacturing and customer assembly processes. Formed dimples do not have this issue.

FIG. 19

- OIS that uses formed or plated dimples instead of ball bearings.
  - Optimum is 3 dimples to replace the 3 ball bearings
  - Optimum dimple material could be SST with laser polish and/or coining operation
  - Optional dimple material could be high stiffness smooth plastic (example: polyoxymethylene, trade name Delrin)
  - Another material could be ceramic coated metal or a ceramic dot
- Dimples interface with a low friction surface with good wear properties.
  - Optimum may be plastic (polyoxymethylene, trade name Delrin) with a low Ra surface of 0.1um max.
  - May also be metal or plastic layer with low friction coating applied or laser polish or coining.
    - Example of a low friction coating could be the application of Xylan on the contact surface to reduce friction and improve wear

FIG. 20

CAMERA LENS SUSPENSION WITH LIMITER

CROSS REFERENCE TO RELATED APPLICATIONS

This application is a continuation of U.S. patent application Ser. No. 15/156,545, filed May 17, 2016, entitled Camera Lens Suspension with Limiter, which is a continuation of U.S. patent application Ser. No. 14/951,051, filed Nov. 24, 2015, entitled Camera Lens Suspension with Polymer Bearings, now U.S. Pat. No. 9,366,879, which is incorporated herein by reference in its entirety and for all purposes, and which claims the benefit of the following U.S. Provisional Applications, both which are incorporated herein by reference in their entirety and for all purposes: No. 62/086,595, filed on Dec. 2, 2014, entitled Optical Image Stabilization (OIS) Camera Lens Suspension, and No. 62/129,562, filed on Mar. 6, 2015, entitled Two-Piece Camera Lens Suspension with Integrated Electrical Leads.

FIELD OF THE INVENTION

The invention relates generally to camera lens suspensions such as those incorporated into mobile phones. In particular, the invention relates to limiters between relatively movable components of such suspensions.

BACKGROUND

PCT International Application Publication Nos. WO 2014/083318 and WO 2013/175197 disclose a camera lens optical image stabilization (OIS) suspension system that has a moving assembly (to which a camera lens element can be mounted) supported by a flexure element or spring plate on a stationary support assembly. The moving assembly is supported for movement on the support assembly by plural balls. The flexure element, which is formed from metal such as phosphor bronze, has a moving plate and flexures. The flexures extend between the moving plate and the stationary support assembly and function as springs to enable the movement of the moving assembly with respect to the stationary support assembly. The balls allow the moving assembly to move with little resistance. The moving assembly and support assembly are coupled by shape memory alloy (SMA) wires extending between the assemblies. Each of the SMA wires has one end attached to the support assembly, and an opposite end attached to the moving assembly. The suspension is actuated by applying electrical drive signals to the SMA wires. The above-identified PCT publications are incorporated herein by reference for all purposes.

There remains a continuing need for improved lens suspensions. Suspension structures of these types that are highly functional, robust and efficient to manufacture would be particularly desirable.

SUMMARY

Embodiments of the invention include a suspension assembly with a limiter. In embodiments, the suspension assembly comprises a support member including a wire attach structure, and a moving member coupled to the support member. The moving member includes a plate, flexure arms extending from the plate and coupled to the support member, and a wire attach structure. A bearing supports the plate of the moving member for movement with respect to the support member. A shape memory alloy wire is coupled to and extends between the wire attach structures of the support member and the moving member. The limiter limits a range of movement of the moving member with respect to the support member, and in embodiments includes an opening in one of the moving member plate and the support member, and a stop that includes an engagement portion extending into the opening in the other of the moving member plate and the support member. The opening has a first diameter, and the engagement portion has a second diameter that is less than the first diameter.

BRIEF DESCRIPTION OF THE DRAWINGS

FIGS. 12-18 are annotated illustrations of suspensions that can include the bearings in accordance with embodiments of the invention.

FIGS. 19-20 describe features of bearings in accordance with embodiments of the invention.

DESCRIPTION OF THE INVENTION

Figure 1A:
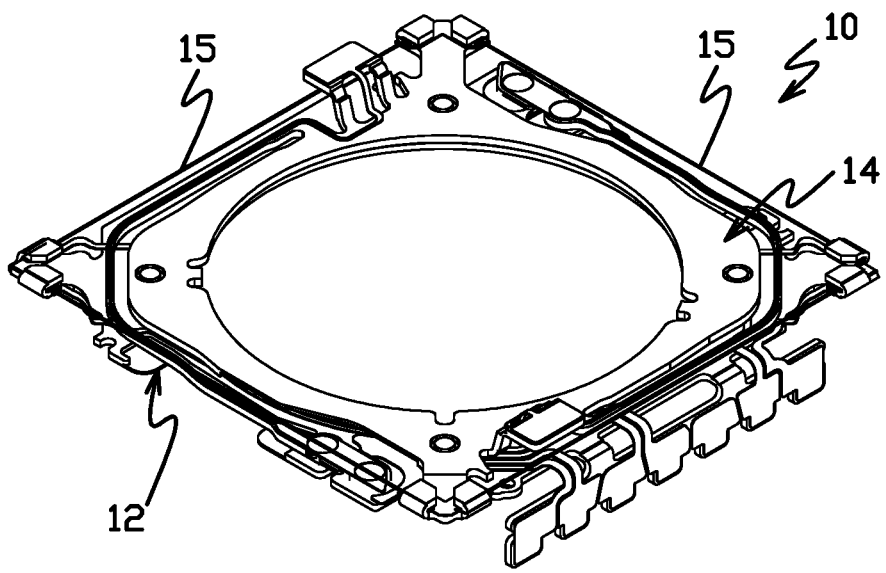
FIG. 1A is a top isometric view of a suspension including bearings in accordance with embodiments of the invention.
Figure 1B:
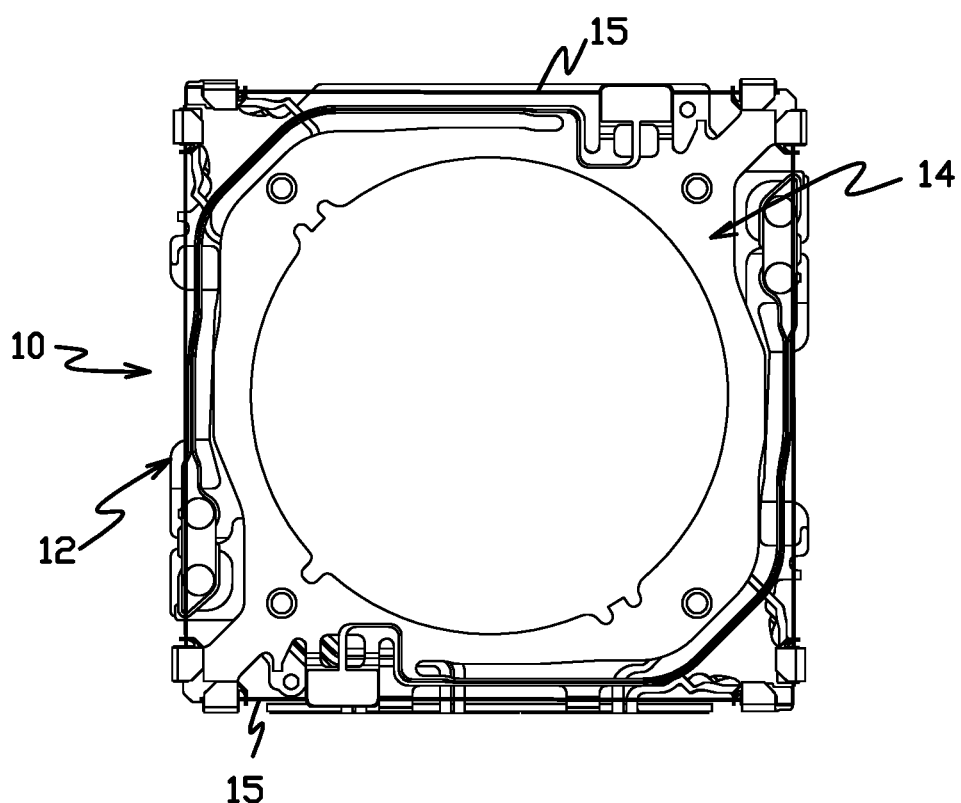
FIG. 1B is a top plan view of the suspension shown in FIG. 1A.
Figure 2A:
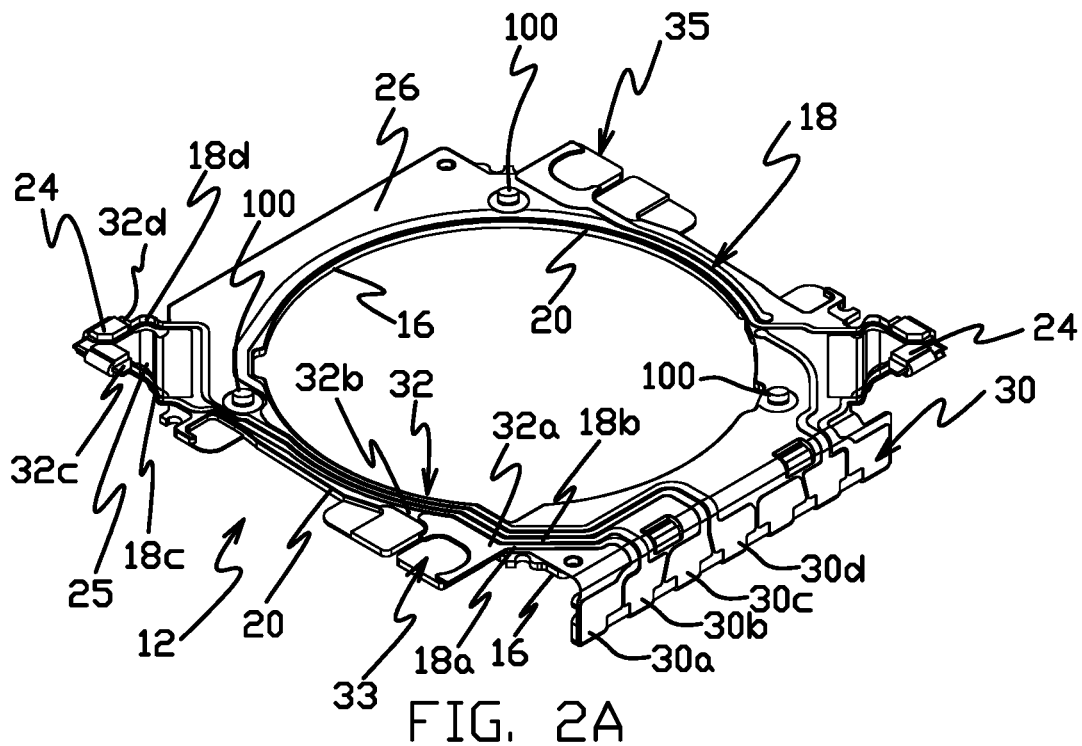
FIG. 2A is a top isometric view of the support member of the suspension shown in FIG. 1A.
Figure 2B:
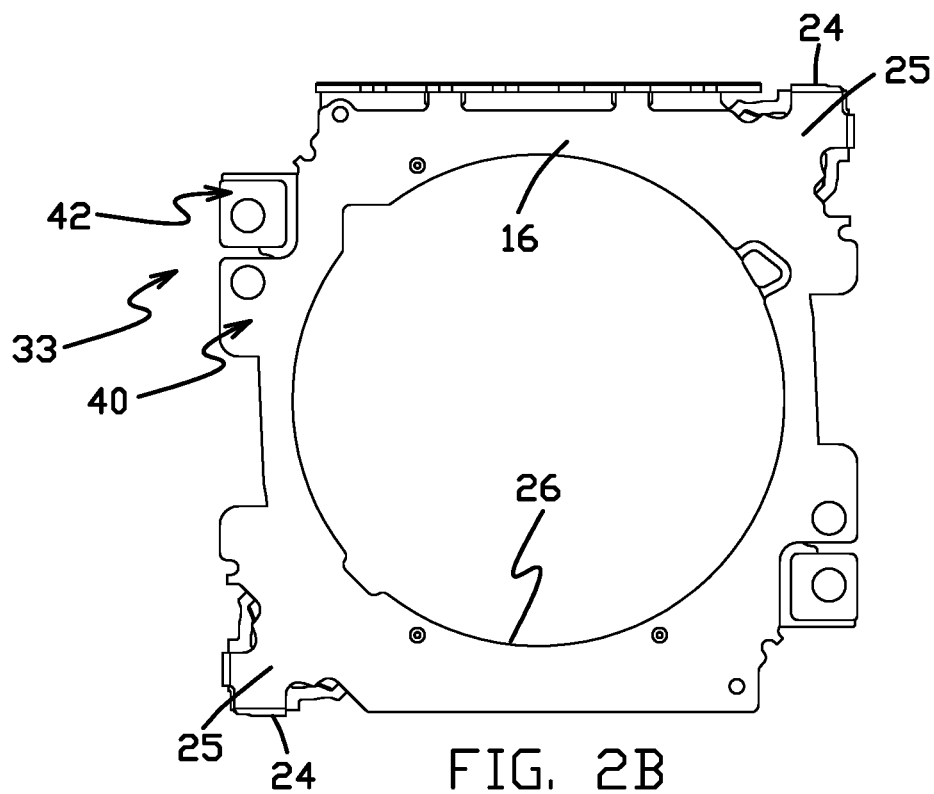
FIG. 2B is a bottom plan view of the support member shown in FIG. 2A.

FIGS. 1A and 1B illustrate a suspension assembly 10 including bearings 100 and sliding bearing interfaces (shown in FIGS. 2A and 8) in accordance with embodiments of the invention. As shown, the suspension assembly 10 includes a flexible printed circuit (FPC) or support member 12 and a spring crimp circuit or moving member 14 that is coupled to the support member. Shape memory alloy (SMA) wires 15 extend between the support member 12 and the moving member 14, and can be electrically actuated to move and control the position of the moving member with respect to the support member. In embodiments, the suspension assembly 10 is a camera lens optical image stabilization (OIS) device that can be incorporated, for example, into mobile phones, tablets, laptop computers.

FIGS. 2A, 2B, 3A and 3B illustrate the support member 12 in greater detail. As shown, the support member 12 includes a base layer 16 and a plurality of conductive traces 18 such as traces 18a-18d in a conductor layer on the base layer. A layer of dielectric 20 is located between the conductive traces 18 and the base layer 16 to electrically insulate the traces from the base layer. A plurality of wire attach structures such as crimps 24 (i.e., static crimps; four are shown in the illustrated embodiment) are located on the base layer 16. In the illustrated embodiment the crimps 24 are organized as two pairs of adjacent structures that are integrally formed on a ledge 25 in the base layer 16 at a level spaced (e.g., in a z-direction) from a major planar surface portion 26 of the base layer. Other embodiments (not shown) include other wire attach structures (e.g., solder pads) and/or wire attach structures that are organized in other arrangements (e.g., singly rather than in pairs).

Figure 4A:
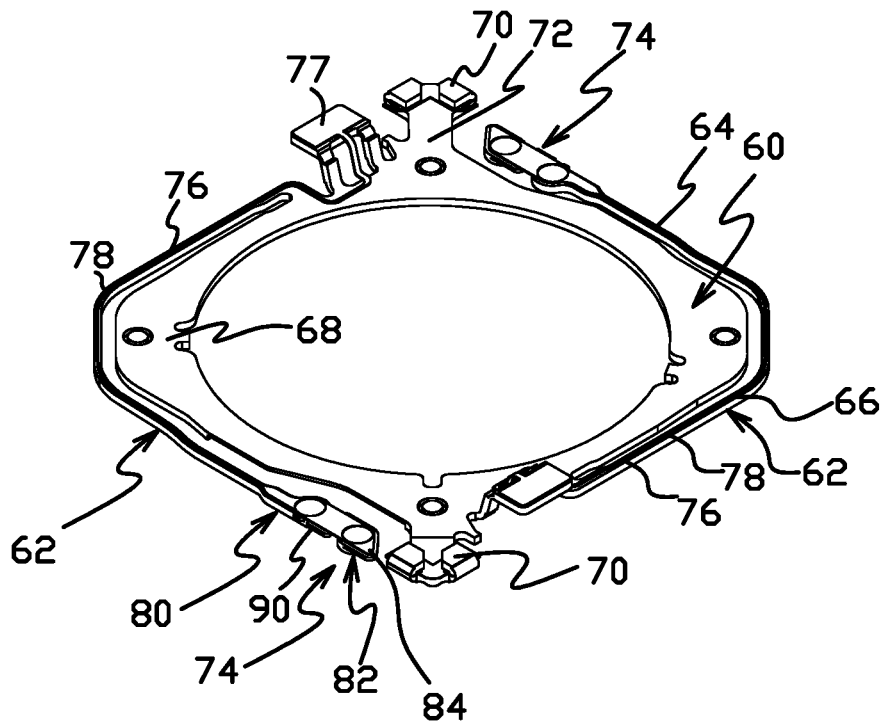
FIG. 4A is a top isometric view of the moving member of the suspension shown in FIG. 1A.
Figure 4B:
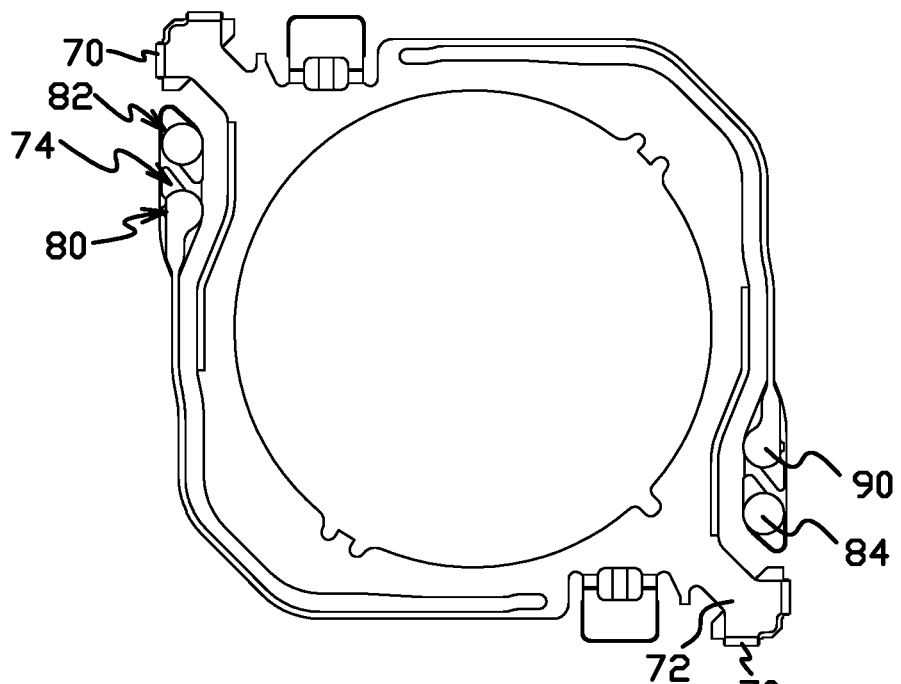
FIG. 4B is a bottom plan view of the moving member shown in FIG. 4A.
Figure 5:
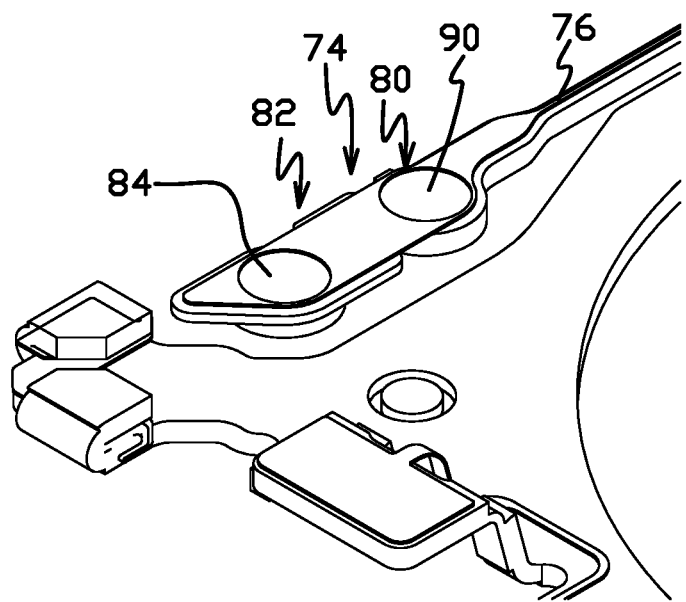
FIG. 5 is a detailed top isometric view of a flexure arm mount region and a wire attach of the moving member shown in FIG. 4A.
Figure 6:
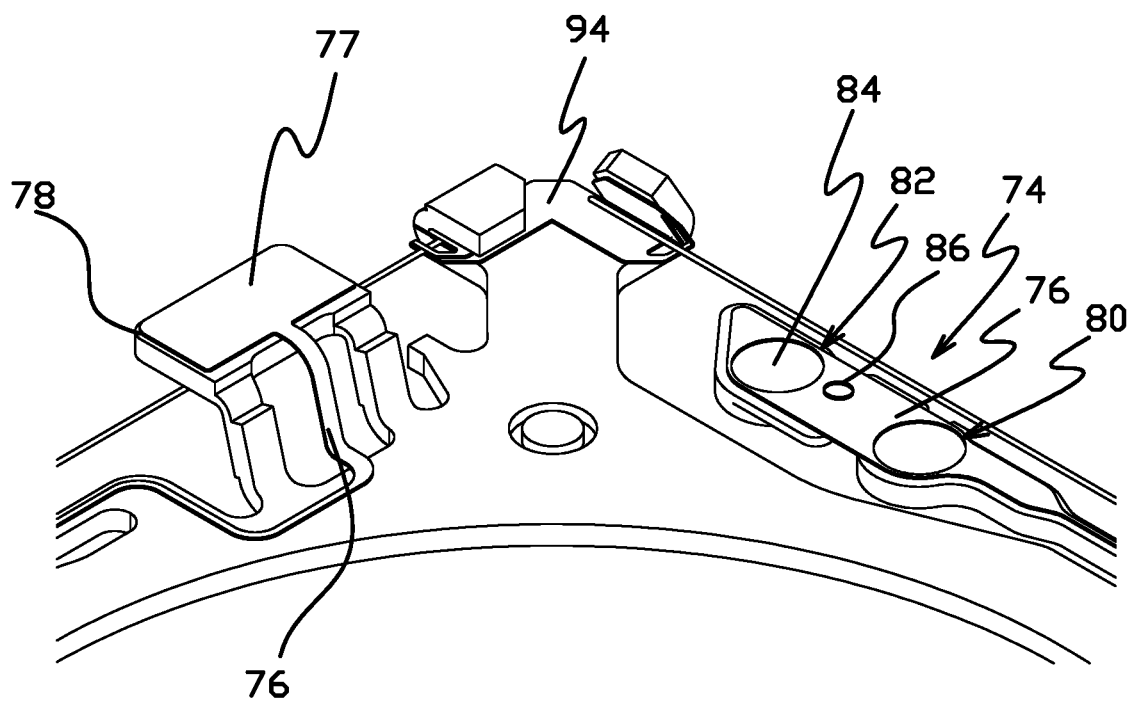
FIG. 6 is a detailed top isometric view of a flexure arm mounting region and a wire attach of the moving member shown in FIG. 4A.

In embodiments, bearings 100, which are described in greater detail below, extend from the support member 12 (e.g., from portion 26 of base layer 16) and engage a bottom side of the moving member 14 (i.e., the side shown in FIG. 4B) to movably support the moving member with respect to the support member. The bearings 100 cooperate with the plate 60 of the moving member 14 to provide slidable polymer interfaces between the moving member and the support member 12. In other embodiments, the bearings are mounted to and extend from the moving member 14 to slidably engage the support member 12. Although three bearings 100 are shown in the illustrated embodiments, other embodiments have more or fewer bearings.

Traces 18 include terminals 30 and contact pads 32 in the conductor layer on the base layer 16. Each of the traces 18 couples a terminal 30 to a contact pad 32. For example, contact pads 32a and 32b are at a first mount region 33 of the support member 12, and traces 18a and 18b couple terminals 30a and 30b to pads 32a and 32b, respectively. Contact pads 32 at a second mount region 35 are similarly coupled to terminal 30 by traces 18. A contact pad 32 is located at each of the crimps 24 in the illustrated embodiment, and each of the contact pads is coupled by a separate trace to a separate terminal 30 (e.g., trace 18d couples terminal 30d to pad 32d). The portion of the base layer 16 on which the terminals 30 are located is formed out of the plane of the major surface portion 26 (e.g., perpendicular to the plane of the major surface portion in the illustrated embodiment).

Figure 3A:
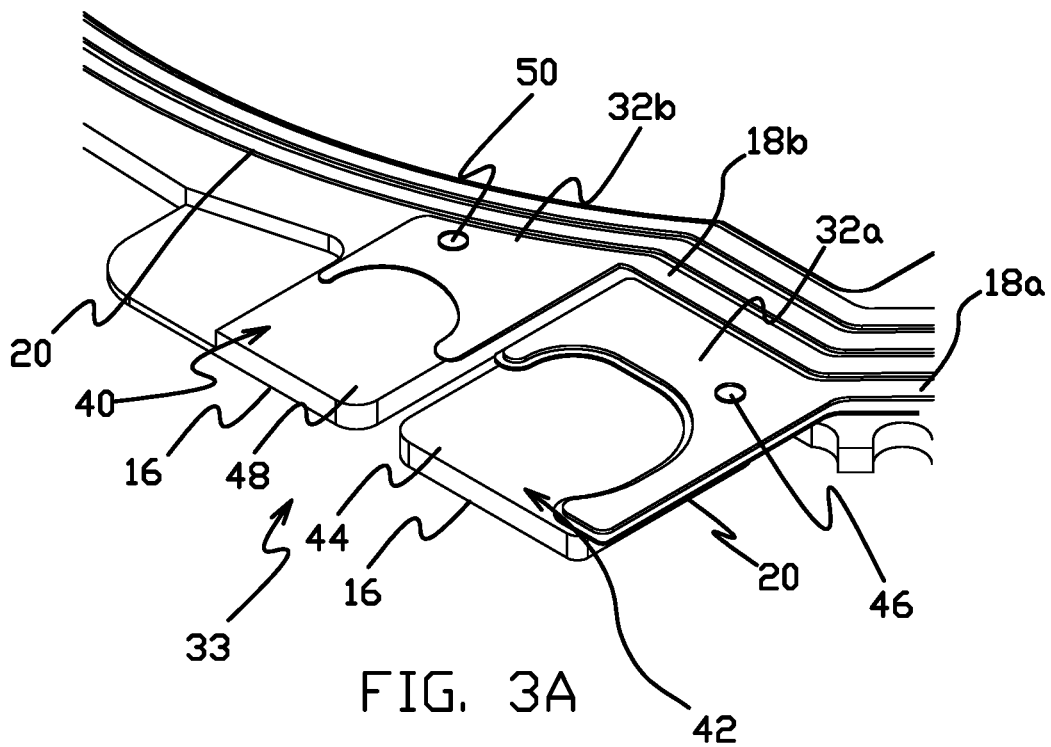
FIG. 3A is a detailed top isometric view of a mount region of the support member shown in FIG. 2A.
Figure 3B:
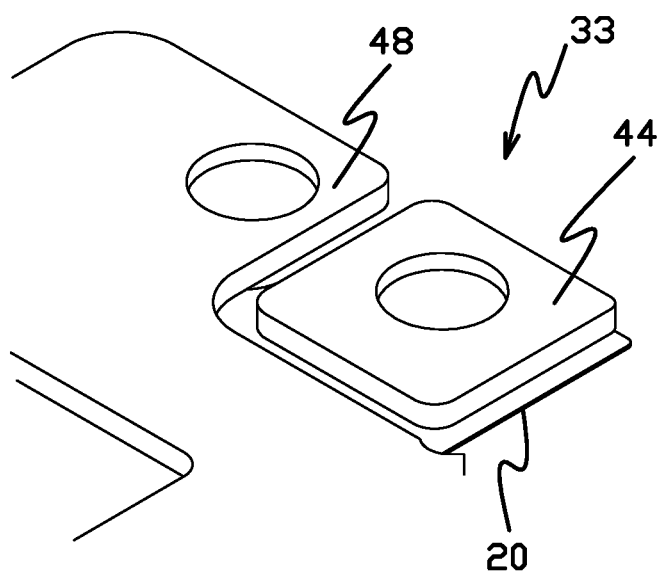
FIG. 3B is a detailed bottom isometric view of the mount region of the support member shown in FIG. 2A.

FIGS. 3A and 3B illustrate in greater detail embodiments of the mount region 33 of the support member 12. As shown, the mount region 33 includes first and second mounting pads 40 and 42. Mounting pad 42 includes an island or pad portion 44 in the base layer 16 that is electrically isolated from other portions of the base layer. The island pad portion 44 can be supported in part from adjacent portions of the base layer 16 by areas of dielectric 20 that extend between the island pad portion and adjacent portions of the base layer. Trace 18a and contact pad 32a extend to the island pad portion 44, and in embodiments are electrically connected to the island pad portion 44 by an electrical connection such as a plated or other via 46 that extends through the dielectric 20 at the mounting pad 42. Other embodiments include other electrical connections in place of or in addition to via 46, such as, for example, conductive adhesive that extends between the contact pad 32a and island pad portion 44 over the edges of the dielectric 20. Mounting pad 40 is adjacent to mounting pad 42, and includes a pad portion 48 in the base layer 16 (that in embodiments functions as an electrical ground or common structure), and an electrical connection such as via 50 that connects the contact pad 32b to the pad portion 48. The mount region 35 can be similar to mount region 33.

FIGS. 4A, 4B, 5, 6 and 7 illustrate embodiments of the moving member 14 in greater detail. As shown, the moving member 14 includes a plate 60 and spring or flexure arms 62 extending from the plate 60. In the illustrated embodiments, the plate 60 is a rectangular member, and each flexure arm 62 is an elongated member having first and second portions 64 and 66 that extend along two sides of the periphery of the plate. The plate 60 and flexure arms 62 are formed in a spring metal base layer 68 such as stainless steel. Moving member 14 also includes SMA wire attach structures such as crimps 70 (moving crimps; four are shown in the illustrated embodiment, organized in pairs). In the illustrated embodiment, the crimps 70 are unitary with and formed from the same spring metal base layer 68 as the plate 60 (i.e., on ends of arms 72 extending from the plate). Moving member 14 is configured differently in other embodiments. For example, in other embodiments (not shown) the flexure arms 62 can be shaped differently, be different in number, organized differently, and/or can extend from other locations on the plate 60. In still other embodiments (not shown), the crimps 70 can be formed as separate structures that are attached to the plate 60 (i.e., not unitary with the plate). Other embodiments (not shown) include other types of wire attach structures (e.g., solder pads) and/or wire attach structures that are organized in other arrangements (e.g., singly rather than in pairs).

The end portions of the flexure arms 62 have mount regions 74 that are configured to be mounted to the mount regions 33 and 35 of the support member 12. Conductive traces 76 on the base layer 68 extend on the flexure arms 62 from the mount regions 74. In embodiments, the traces 76 also extend on the base layer 68 over portions of the plate 60. In the illustrated embodiment, the traces 76 also extend to contact pads 77 on the arms 72 on the plate 60. In the illustrated embodiment, the contact pads 77 are on platforms extending out of the major planar surface of the plate 60. The contact pads are at other locations (e.g., on the plate 60) in other embodiments (not shown). A layer of dielectric 78 is located between the conductive traces 76 and the base layer 68 to electrically insulate the traces from the base layer.

Mount regions 74 include first and second mounting pads 80 and 82. Each mounting pad 82 includes an island or pad portion 84 in the base layer 68 that is electrically isolated from other portions of the base layer. Each trace 76 extends from the mounting pad 82, over (and electrically insulated from) the mounting pad 80. In the illustrated embodiment, the portions of traces 76 extending between the mounting pads 80 and 82 are enlarged over the portions of the traces on the flexure arms 62 to provide support for the island pad portions 84 in the base layer 68. The traces 76 extend to the island pad portions 84, and in embodiments are electrically connected to the island pad portions by electrical connections such as a plated or other via 86 that extends through the dielectric 78 at the mounting pad 82. Other embodiments include other electrical connections in place of or in addition to vias 86, such as conductive adhesive that extends between the trace 76 and island pad portion 84 over the edges of the dielectric 78. Mounting pad 80 includes a pad portion 90 in the base layer 68 that is electrically isolated from the trace 76 by the dielectric 78. In the illustrated embodiments, the portions of the traces 76 over the mounting pads 80 and 82 are circular and open in the center, but take other forms in other embodiments (not shown).

Figure 7:
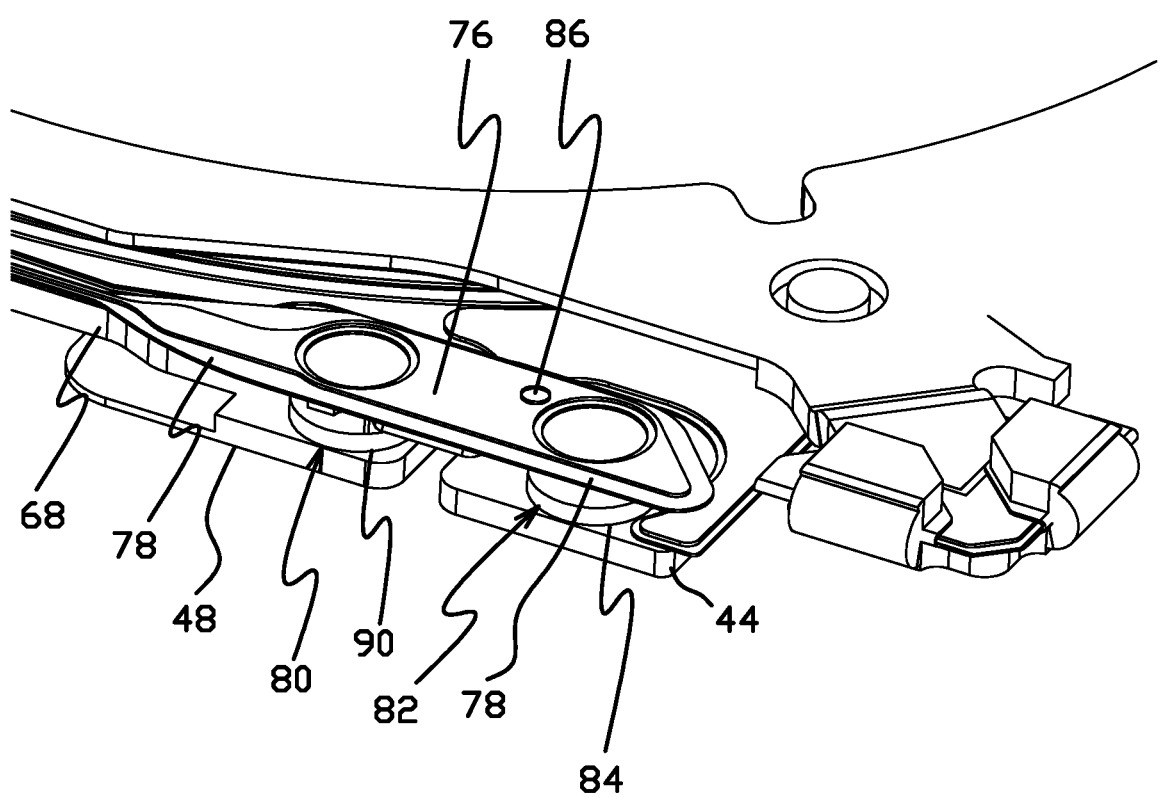
FIG. 7 is a detailed top isometric view of a support member mount region and a flexure arm mount region of the suspension shown in FIG. 1A.

As perhaps best shown in FIGS. 1A and 7, the mount regions 74 of the moving member flexure arms 62 are mechanically attached to the mount regions 33 and 35 of the support member 12. The traces 76 on the flexure arms 62 are electrically connected to the associated traces 18 on the support member 12. In embodiments, the mechanical connections are made by welds between the pad portions 84 and 90 in the base layer 68 of the moving member 14 and the corresponding pad portions 44 and 48 in the base layer 16 of the support member 12. The welds can, for example, be made through the openings in the traces 76 at the pad portions 84 and 90. The welds also enable electrical connections between the pad portions 84 and 90 of the moving member 14 and the corresponding pad portions 44 and 48 of the support member 12. By these electrical connections, the metal base layer 68 of the moving member 14, and thereby the moving crimps 70, are electrically connected in common to an associated trace 18 (i.e., such as 18b through via 50). Similarly, each flexure arm trace 76 is electrically connected to an associated trace 18 (i.e., such as 18a through via 46). Other embodiments of the invention (not shown) have other structures for mechanically mounting the flexure arms 62 to the support member 12, and/or for electrically connecting the traces 76 on the flexure arms to the associated traces 18 on the support member. In the illustrated embodiment, conductive metal regions 94 are located directly on the metal base layer 68 of the moving member 14 at the crimps 70 (i.e., there is no dielectric or other insulating material between the conductive metal regions and the metal base layer) to enhance the electrical connections between the metal base layer and the SMA wires 15 engaged by the crimps.

As described in greater detail below, the support member 12 and moving member 14 can be formed from additive and/or subtractive processes. Base layers 16 and/or 68 are stainless steel in embodiments. In other embodiments the base layers 16 and/or 68 are other metals or materials such as phosphor-bronze. Traces 18 and 76, terminals 30 and contact pads 32 can be formed from copper, copper alloys or other conductors. Polyimide or other insulating materials can be used as the dielectric 20 and 78. Other embodiments of the support member 12 and/or moving member 14 (not shown) have more or fewer traces 18 and 76, and the traces can be arranged in different layouts. Structures other than crimps 24, such as welds, can be used to attach the SMA wires 15 to the base layer 16. Other embodiments of the invention (not shown) have more or fewer crimps 24 and 70, and the crimps can be at different locations on the support member 12 and moving member 14, respectively.

Figure 8:
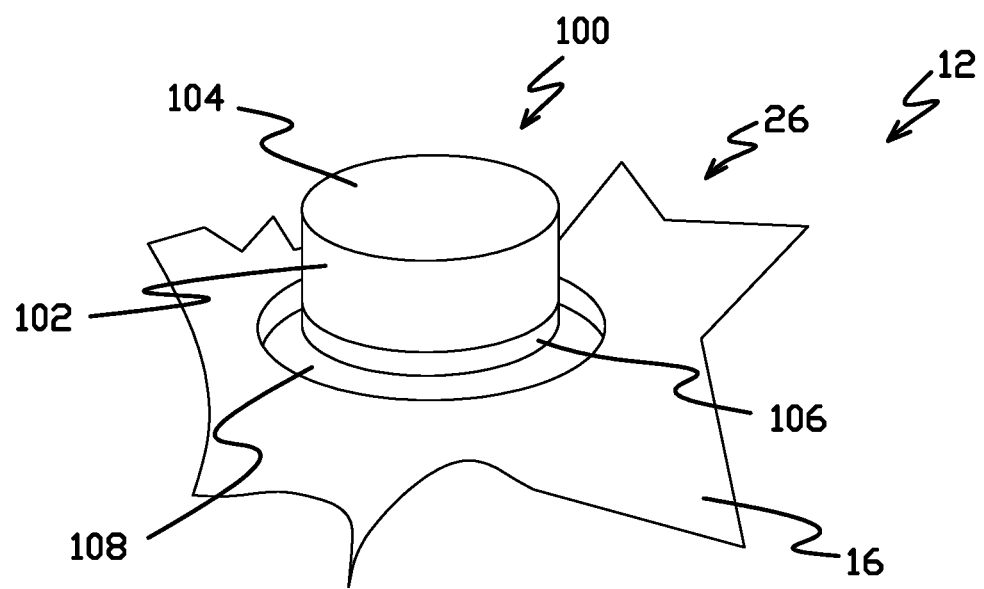
FIG. 8 is a detailed isometric view of one of the bearings shown in FIG. 2A.

FIG. 8 is a detailed illustration of a portion of the support member 12 including a bearing 100. As shown, the bearing 100 includes a spacer portion 102 and a polymer surface region or portion 104. The spacer portion 102 extends from the base layer 16 of the support member 12 to position the surface portion 104 at a height with respect to the support member 12 that will allow the portion of the moving member 14 engaged by the surface portion (e.g. plate 60) to slide on the bearing 100 (e.g., a height of 25-200 μm in embodiments). The spacer portion 102 and the polymer surface portion 104 can be a one-piece polymer member in embodiments. Properties of the polymer surface portion 104 (and optionally the spacer portion 102) can include relatively low friction, relatively low wear and/or relatively high stiffness. In one embodiment, spacer portion 102 and polymer surface portion 104 are formed from materials such as POM (polyoxymethylene). Surface portion 104 is formed from other polymers such as fluoropolymers (e.g., Teflon) in other embodiments. Bearing 100 can be fixedly attached to the support member 12 by adhesive 106 (e.g., thermoset adhesive, 5-25 μm thick in embodiments). In other embodiments, the bearing 100 is attached to support member 12 by other methods or structures such as by welding. In the illustrated embodiment the bearing 100 is attached to the support member 12 in a partial-etched pocket 108 in the base layer 16. In yet other embodiments the bearing 100 is attached to a surface portion of the base layer 16 that is free from a pocket such as 108.

In still other embodiments, the spacer portion 102 can be formed from other materials such as metal, and the surface portion 104 can be a layer or coating of polymer on the metal spacer portion. For example, in embodiments the spacer portion 102 can be a formed dimple in the metal base layer 16. In other embodiments the spacer portion 102 is a separate metal or polymer member that is attached, for example by adhesive or welding, to the support member 12. In still other embodiments, the bearings 100 can extend from the moving member 14 (e.g., from the base layer 68), and slidably engage the support member 12 (e.g, at the base layer 16). Surface portion 104, which has a perimeter, can be generally flat as shown in the embodiment of FIG. 8. In other embodiments the surface portion 104 has other shapes such as a convex shape. The surfaces engaged by the bearing can be metal, and can be processed by laser polishing, electro polishing or other methods to provide a low surface roughness and further reduce friction at the sliding bearing interface. Yet other embodiments include lubricant such as Xylan at the sliding bearing interface.

Bearings such as 100 provide important advantages. For example, in addition to providing a high-quality, reliable, low friction sliding bearing interface, they can be manufactured and assembled relatively efficiently, and enable relatively close spacing between the support member 12 and moving member 14 (i.e., relatively thin suspensions).

Figure 9:
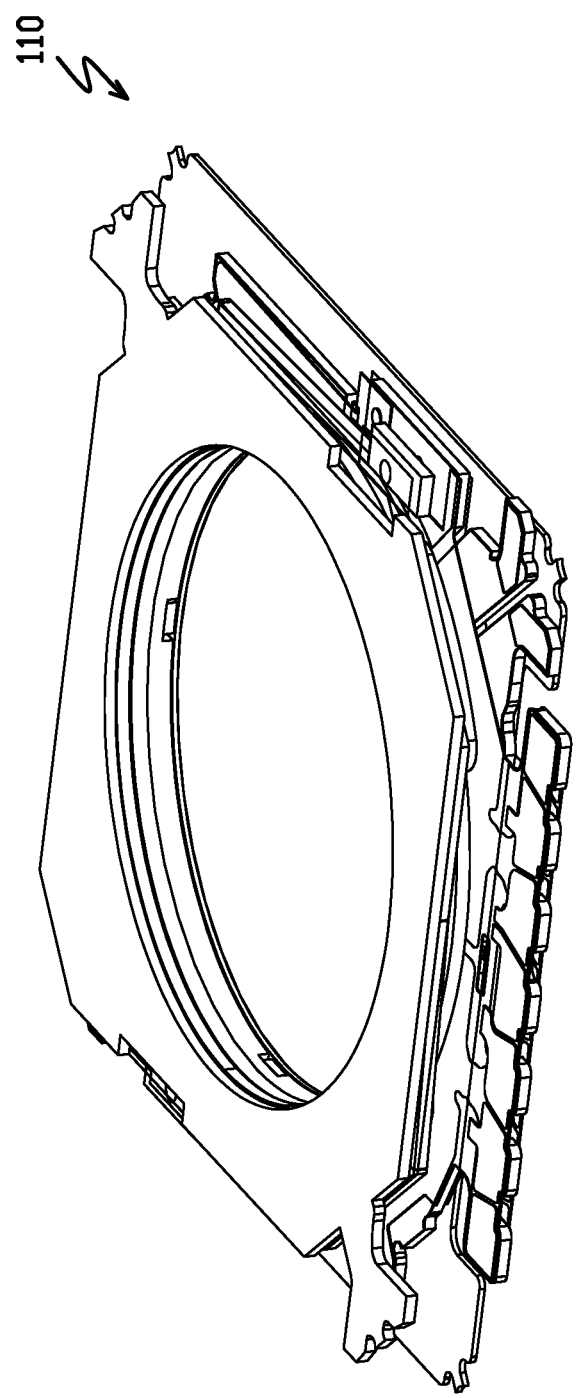
FIG. 9 is a top isometric view of a suspension in accordance with embodiments of the invention.
Figure 10:
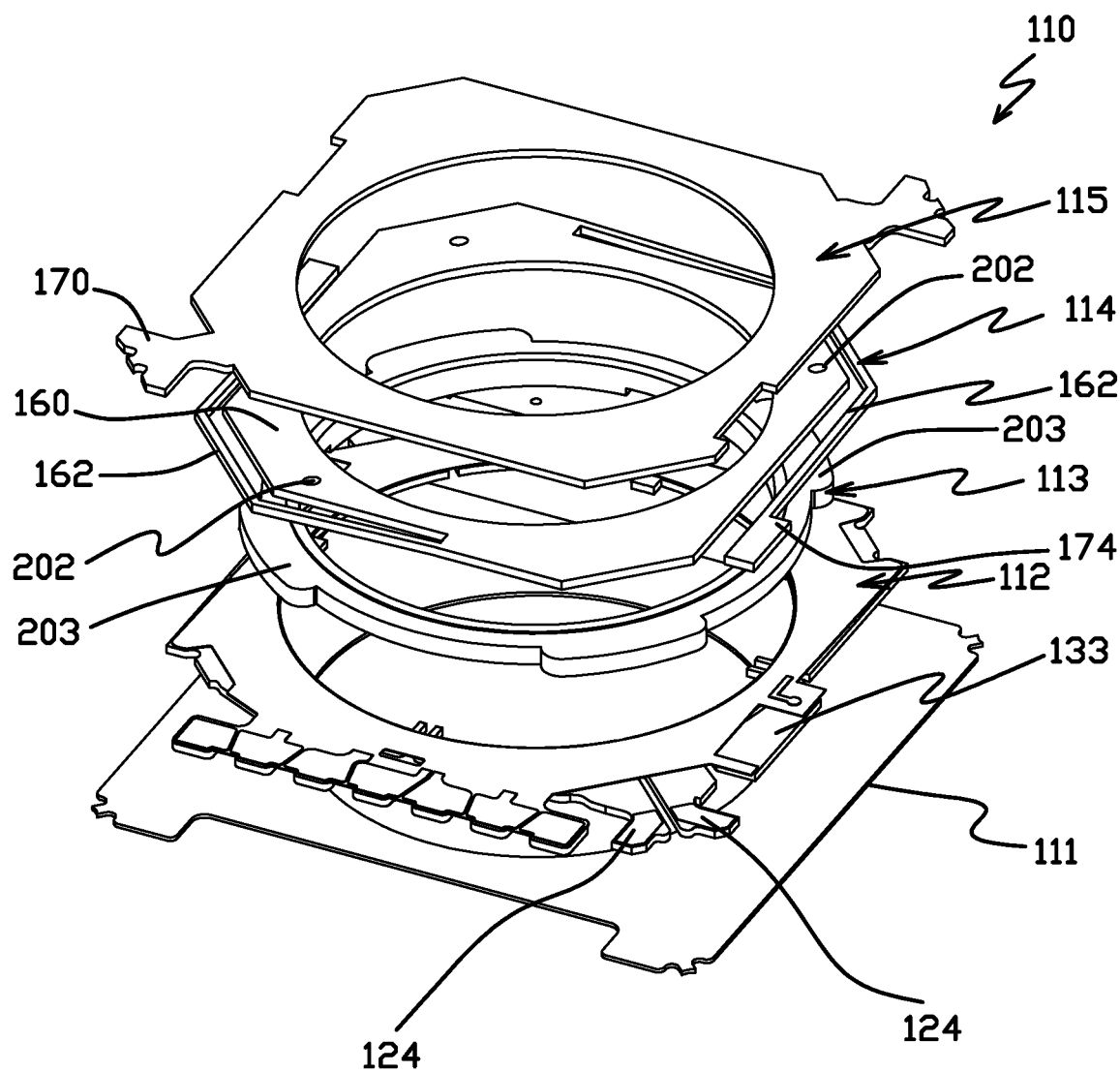
FIG. 10 is an exploded isometric view of the suspension shown in FIG. 9.
Figure 11:
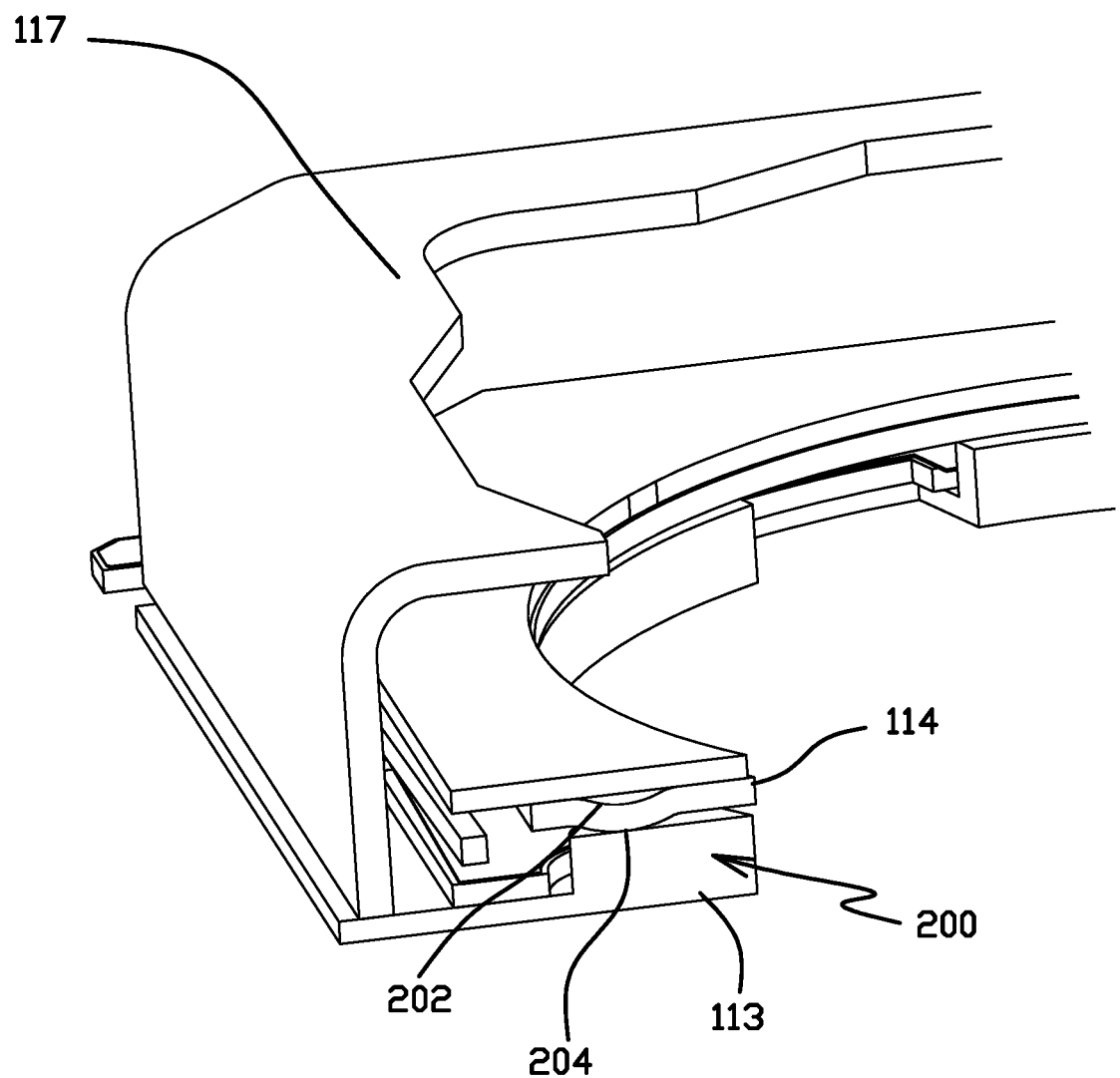
FIG. 11 is a sectional view of the suspension shown in FIG. 9.
Figure 14:
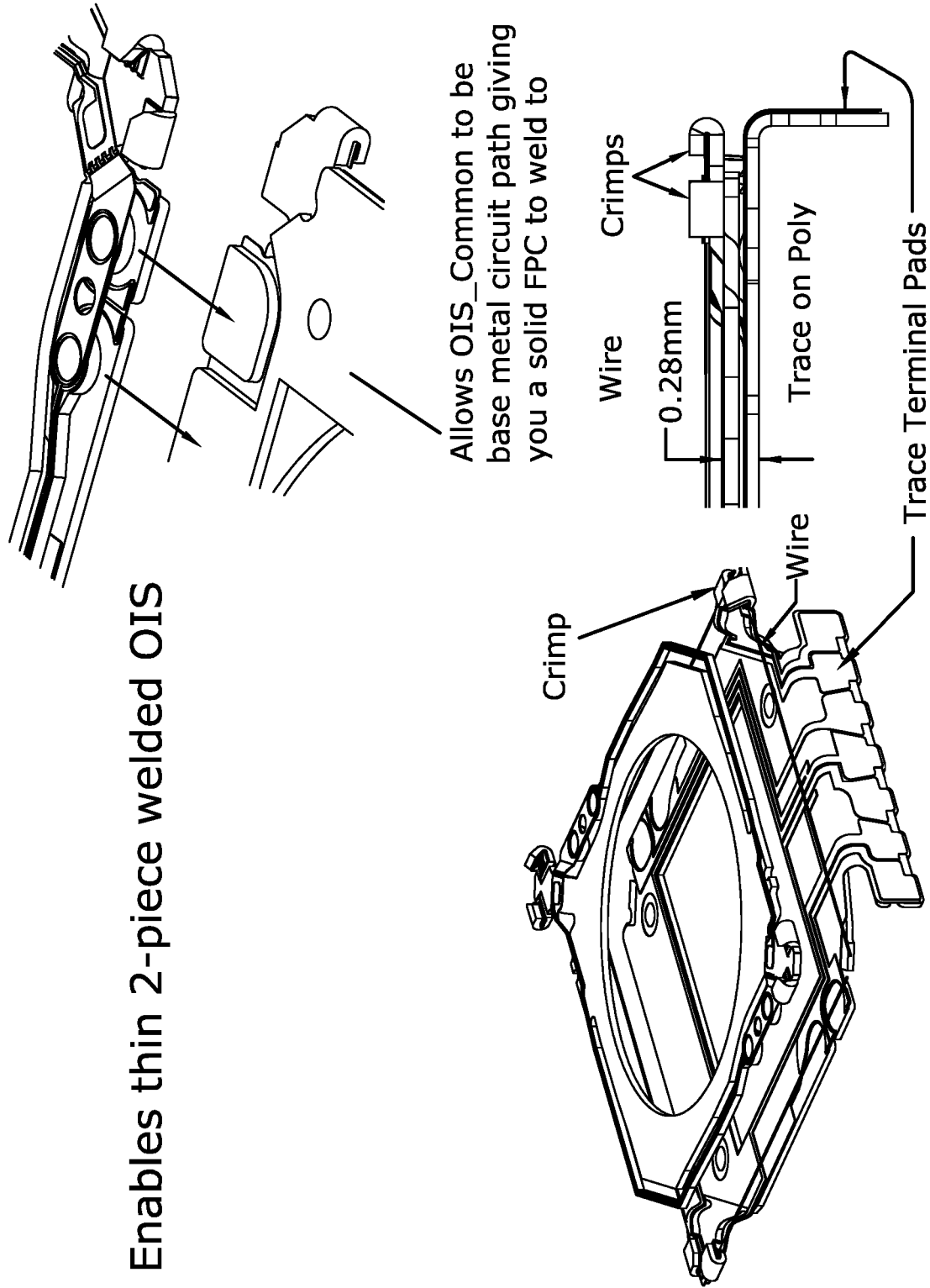
Figure 15:
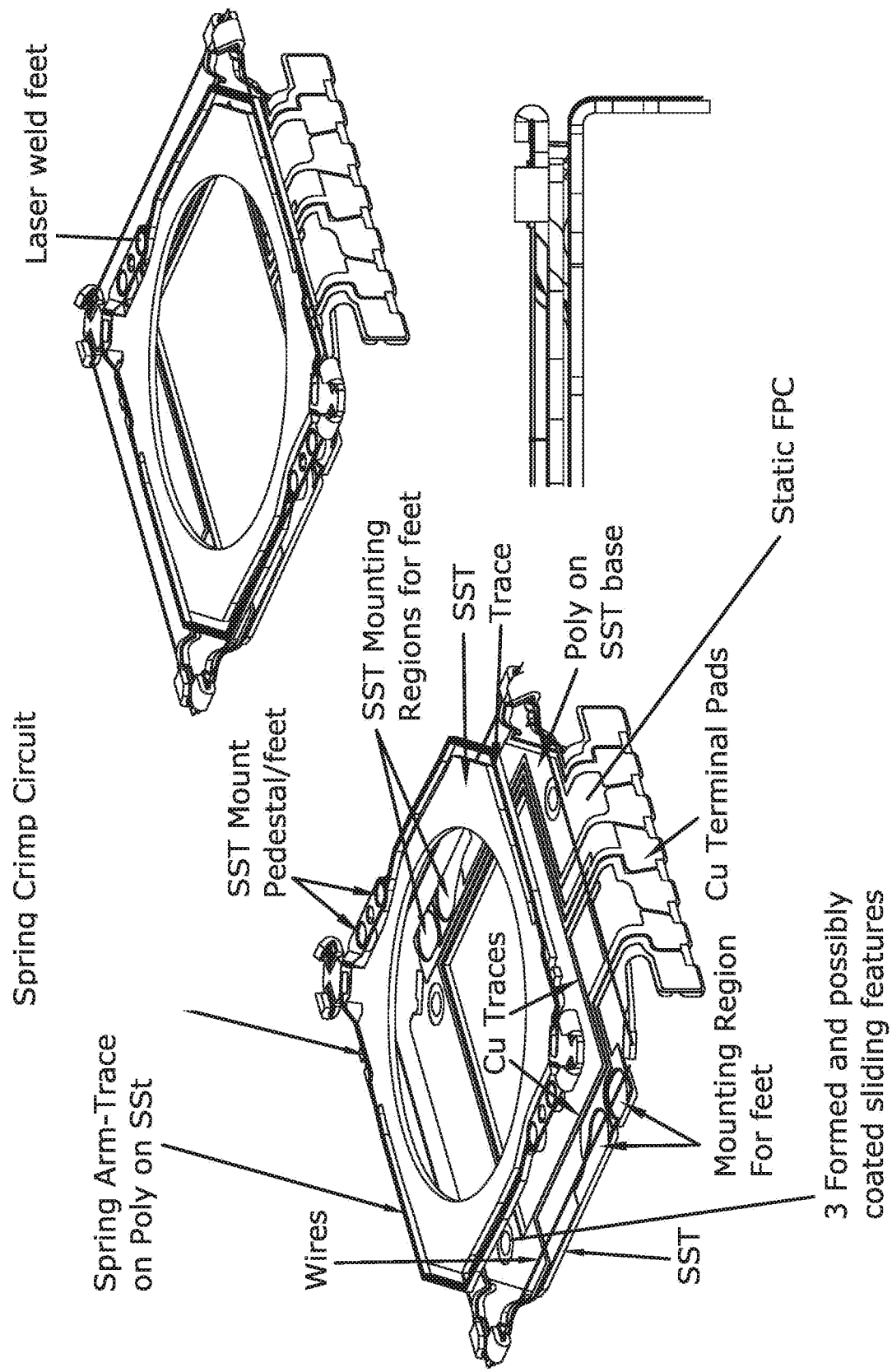
Figure 16:
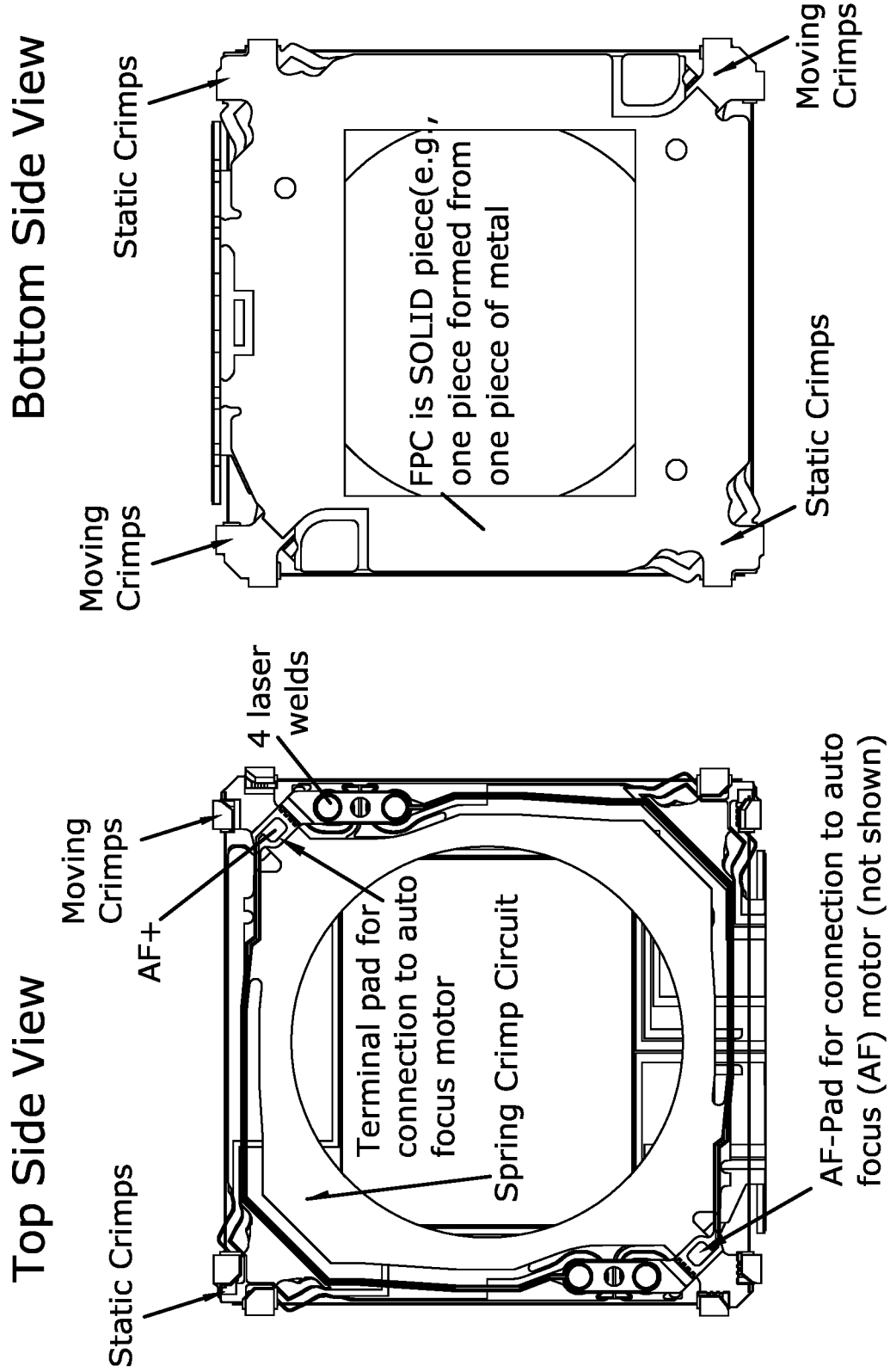
Figure 17:
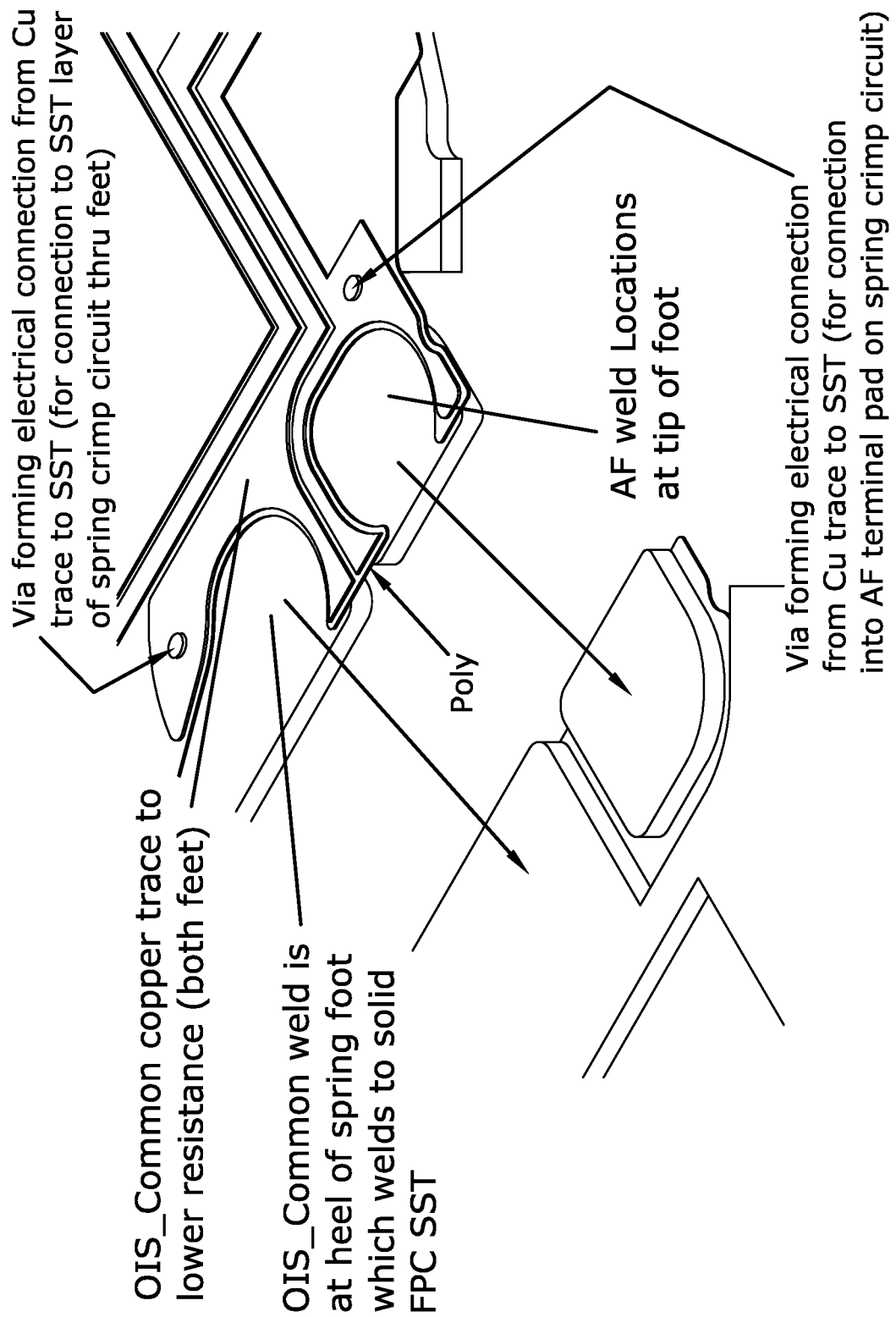
Figure 21:
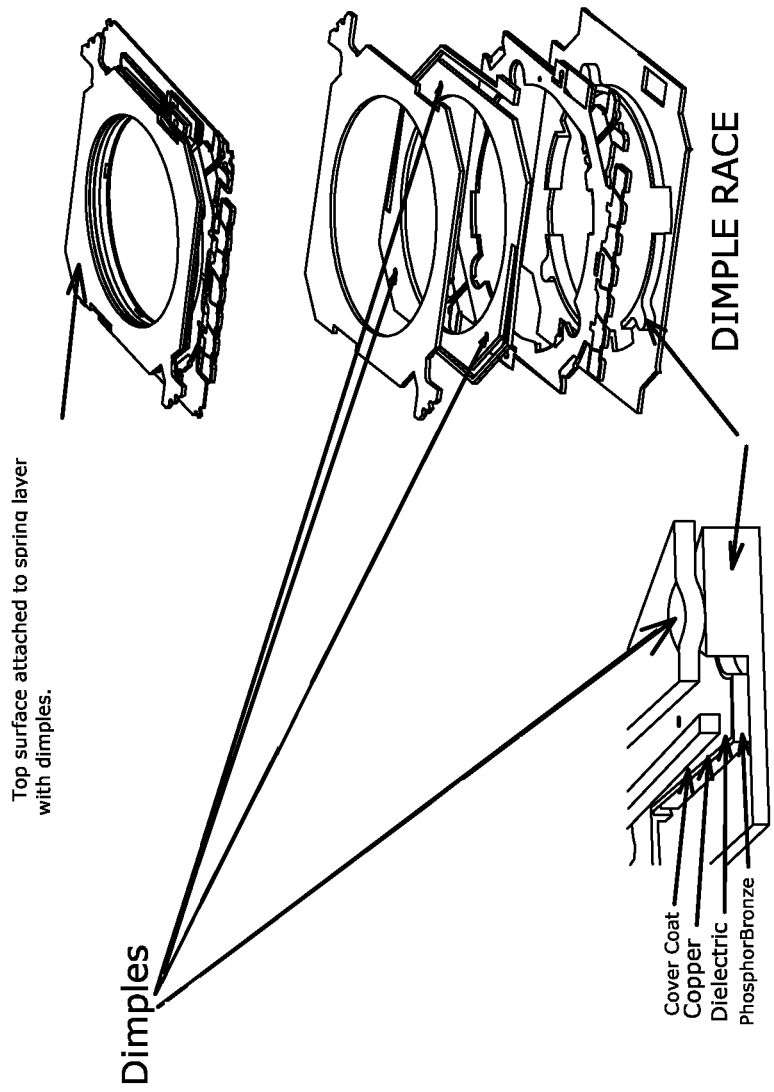
FIGS. 21-25 are annotated illustrations of suspensions including bearings in accordance with embodiments of the invention.
Figure 22:
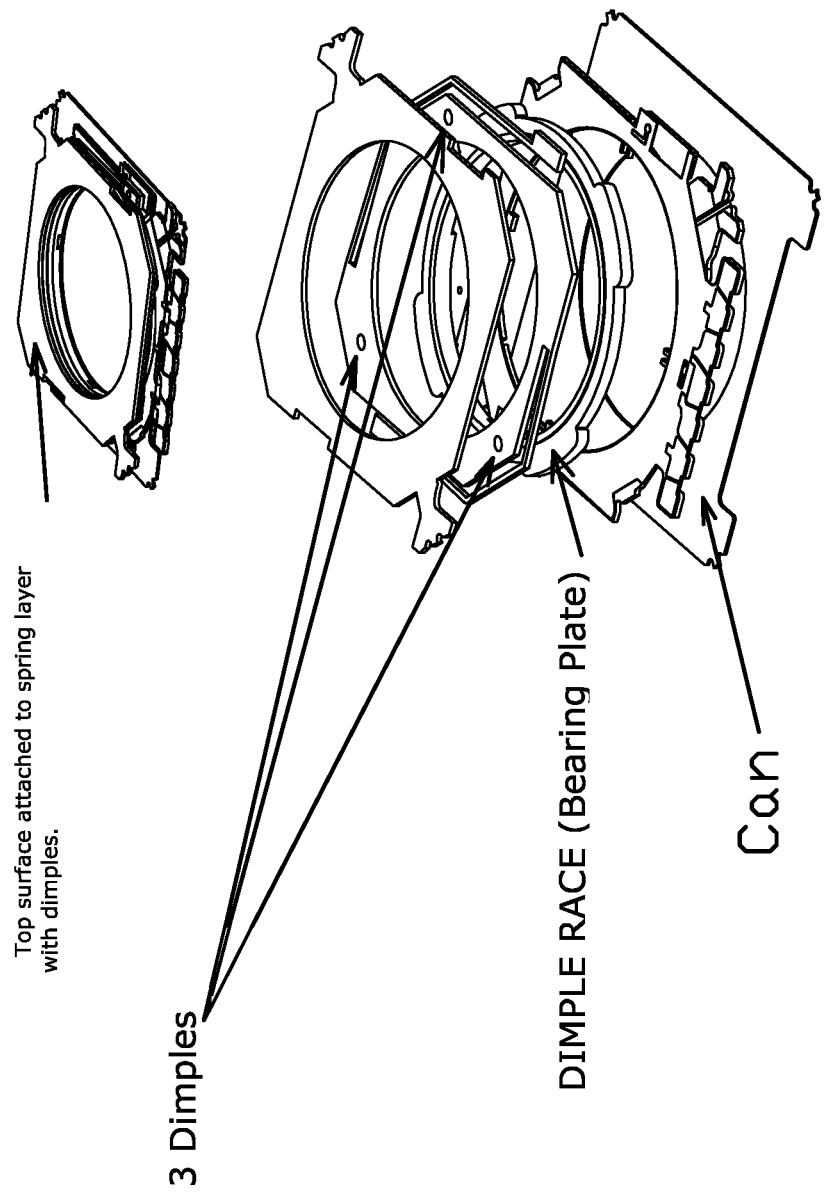
Figure 23:
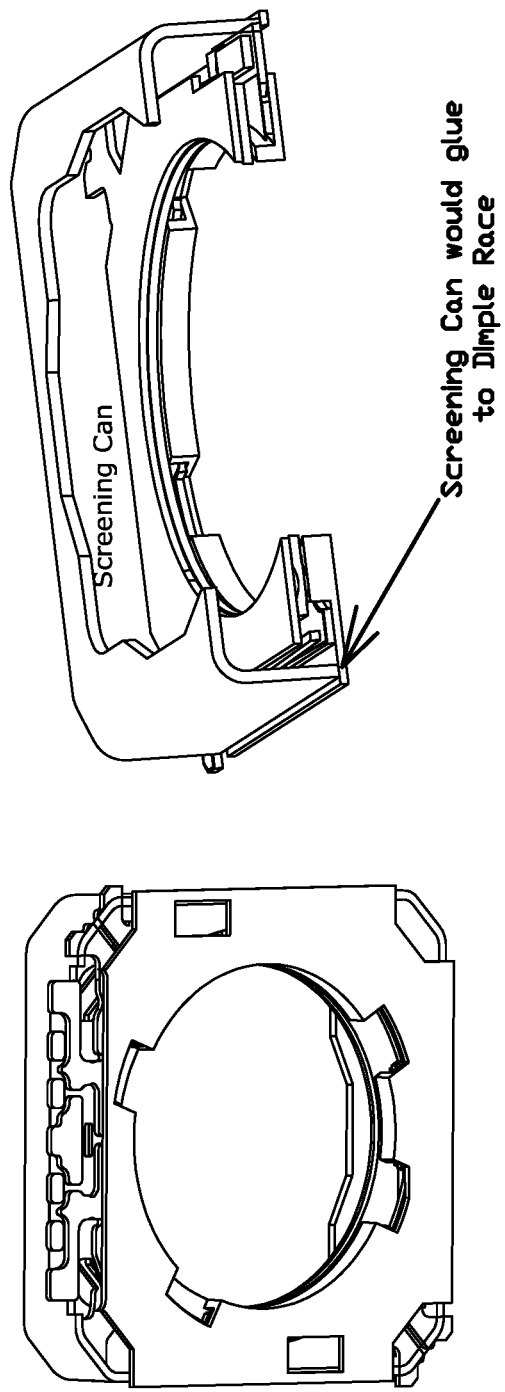
Figure 24:
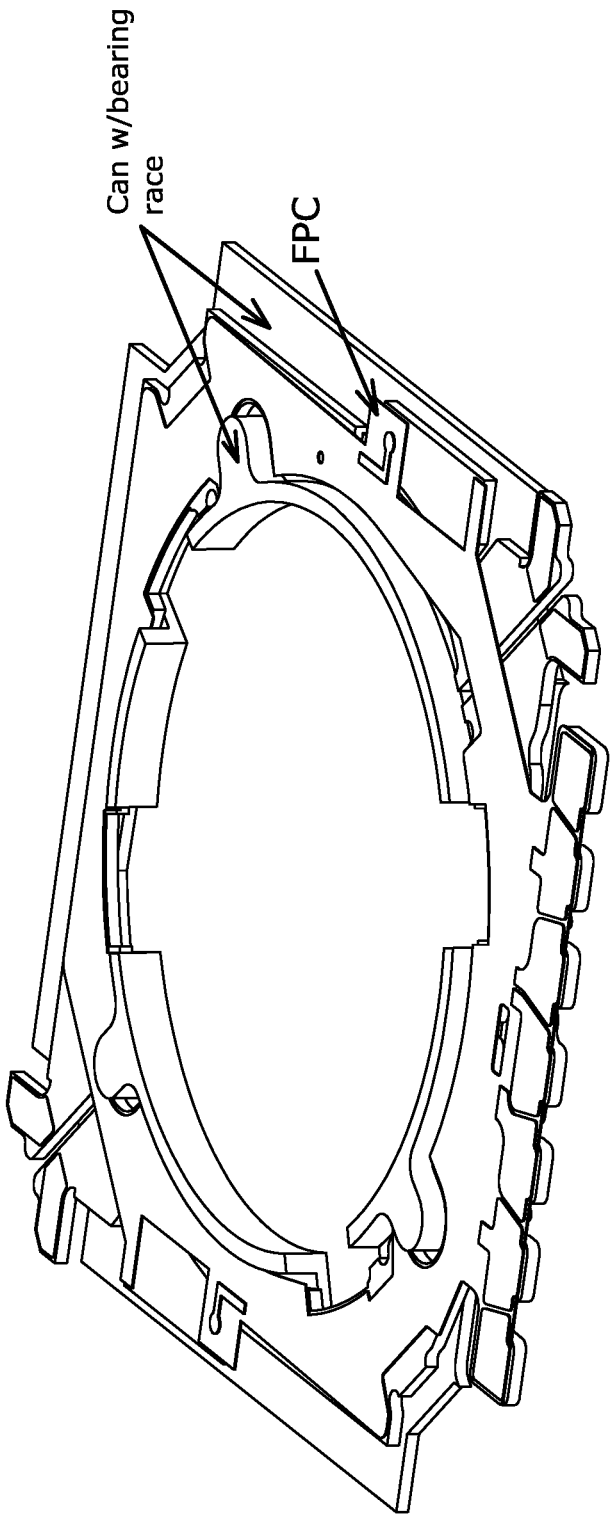
Figure 25:
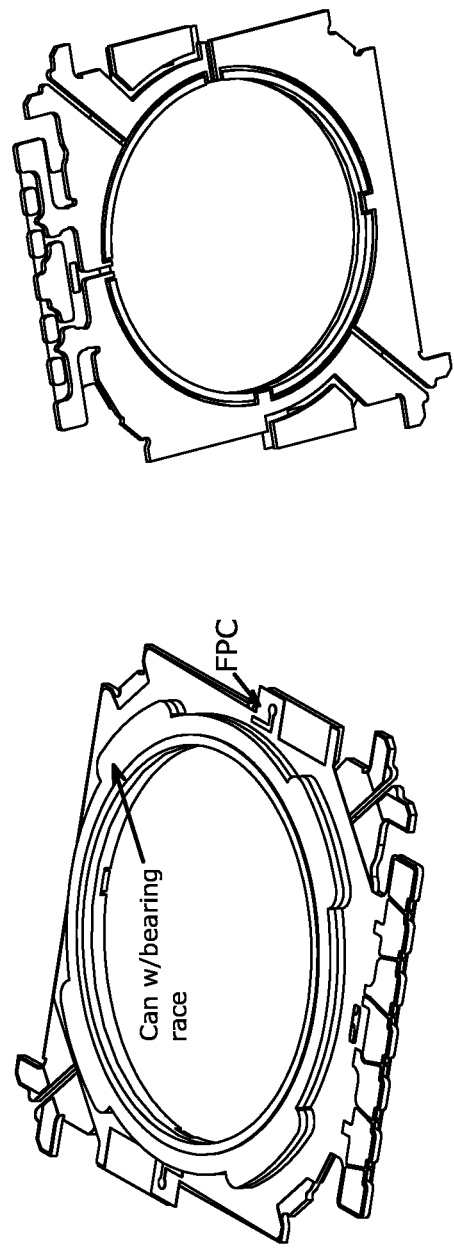
Figure 26A:
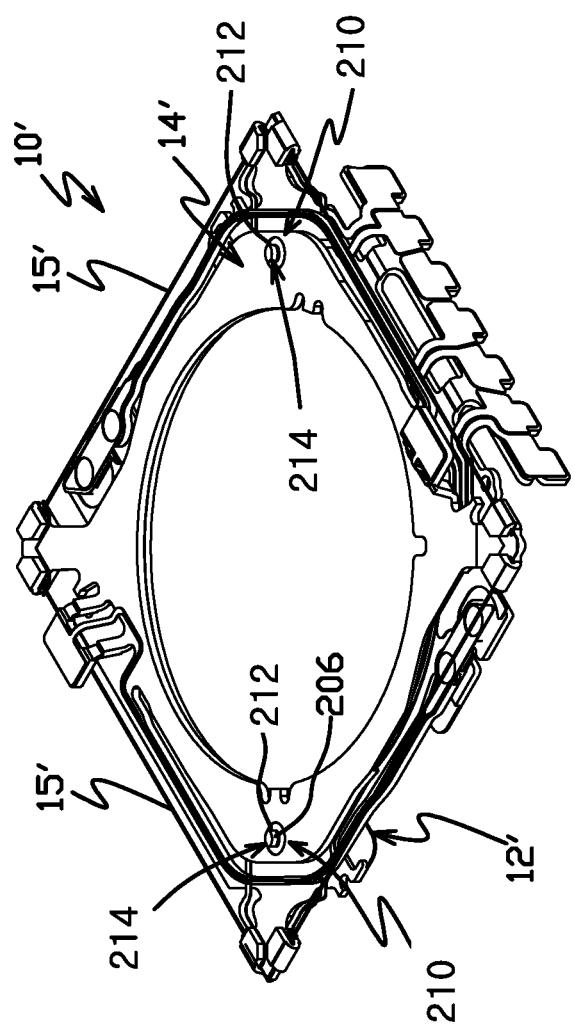
FIG. 26A is a top isometric view of a suspension including a limiter in accordance with embodiments of the invention.
Figure 26B:
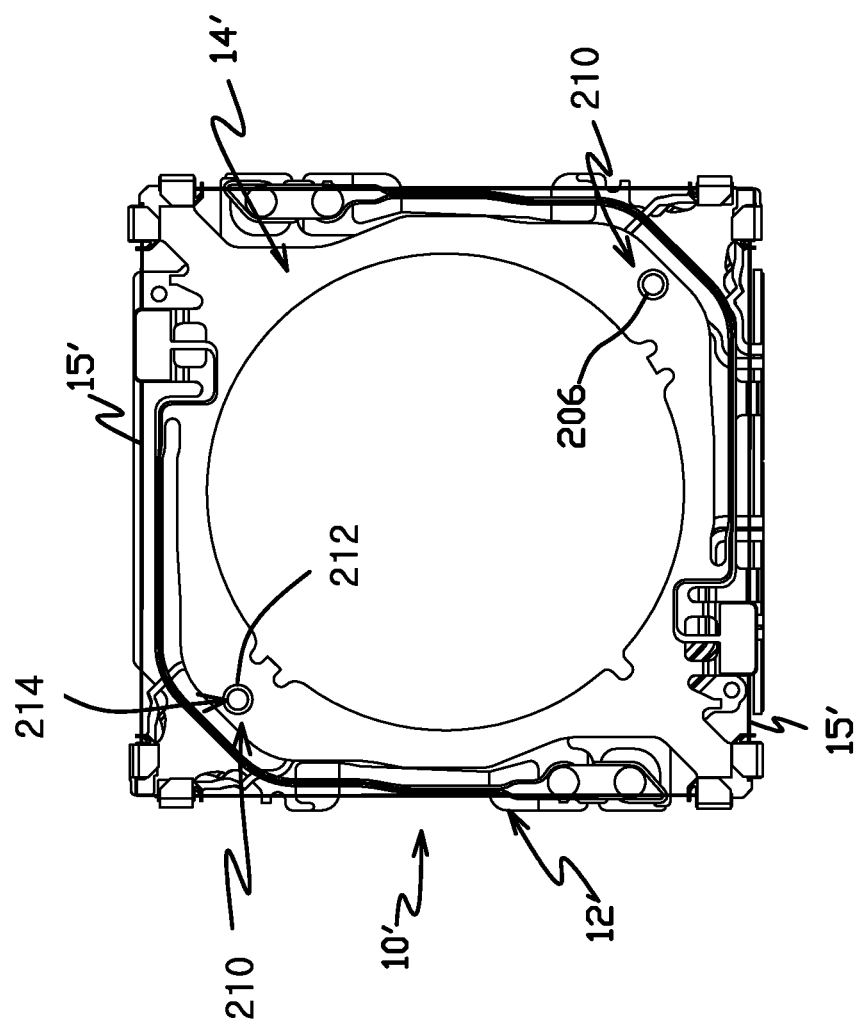
FIG. 26B is a top plan view of the suspension shown in FIG. 1A.
Figure 27:
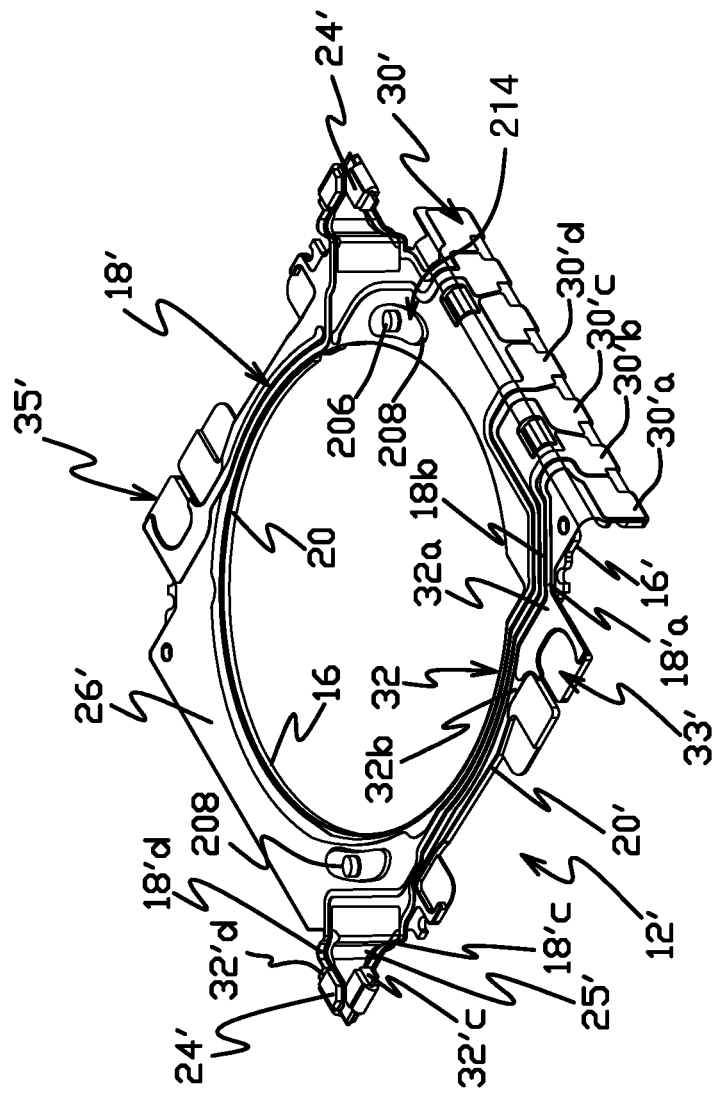
FIG. 27 is a top isometric view of the support member of the suspension shown in FIG. 26A.
Figure 28A:
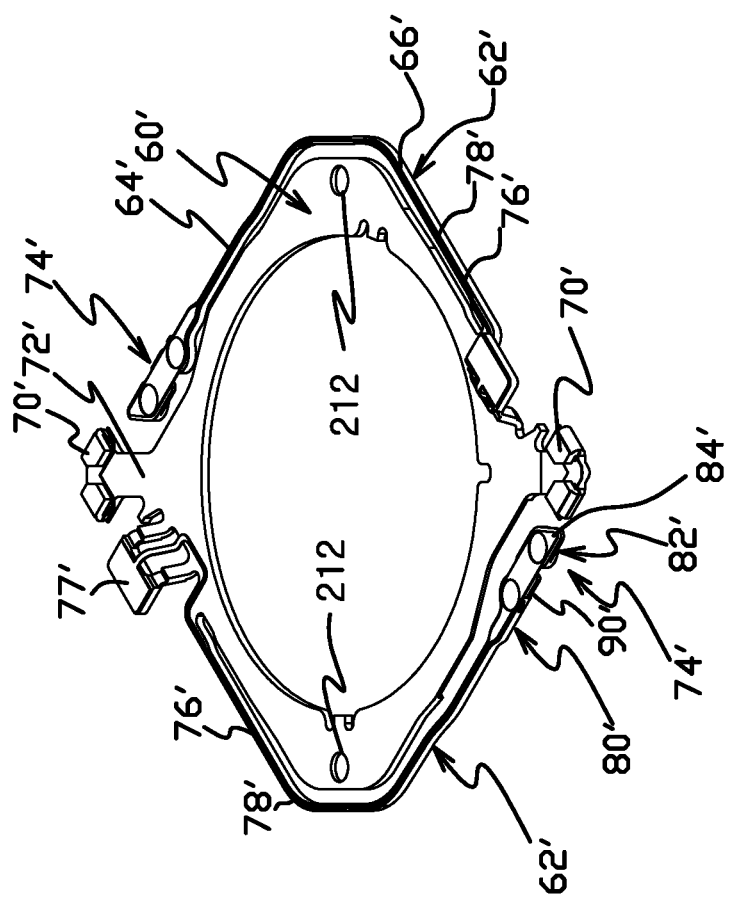
FIG. 28A is a top isometric view of the moving member of the suspension shown in FIG. 26A.
Figure 28B:
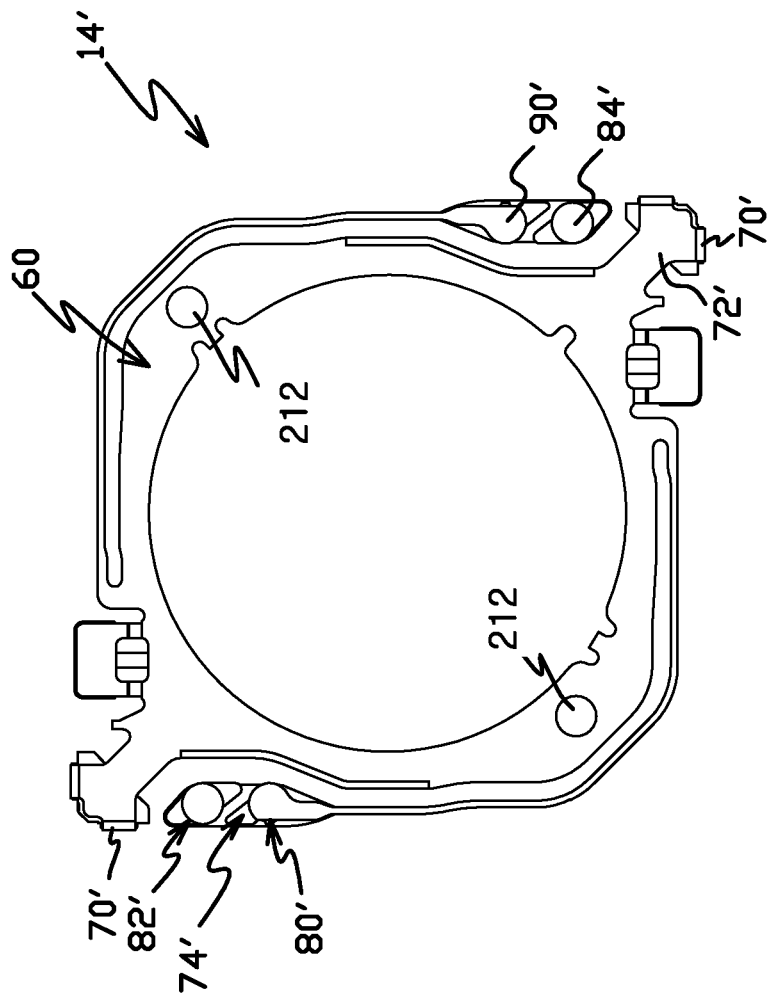
FIG. 28B is a bottom plan view of the moving member shown in FIG. 28A.
Figure 29:
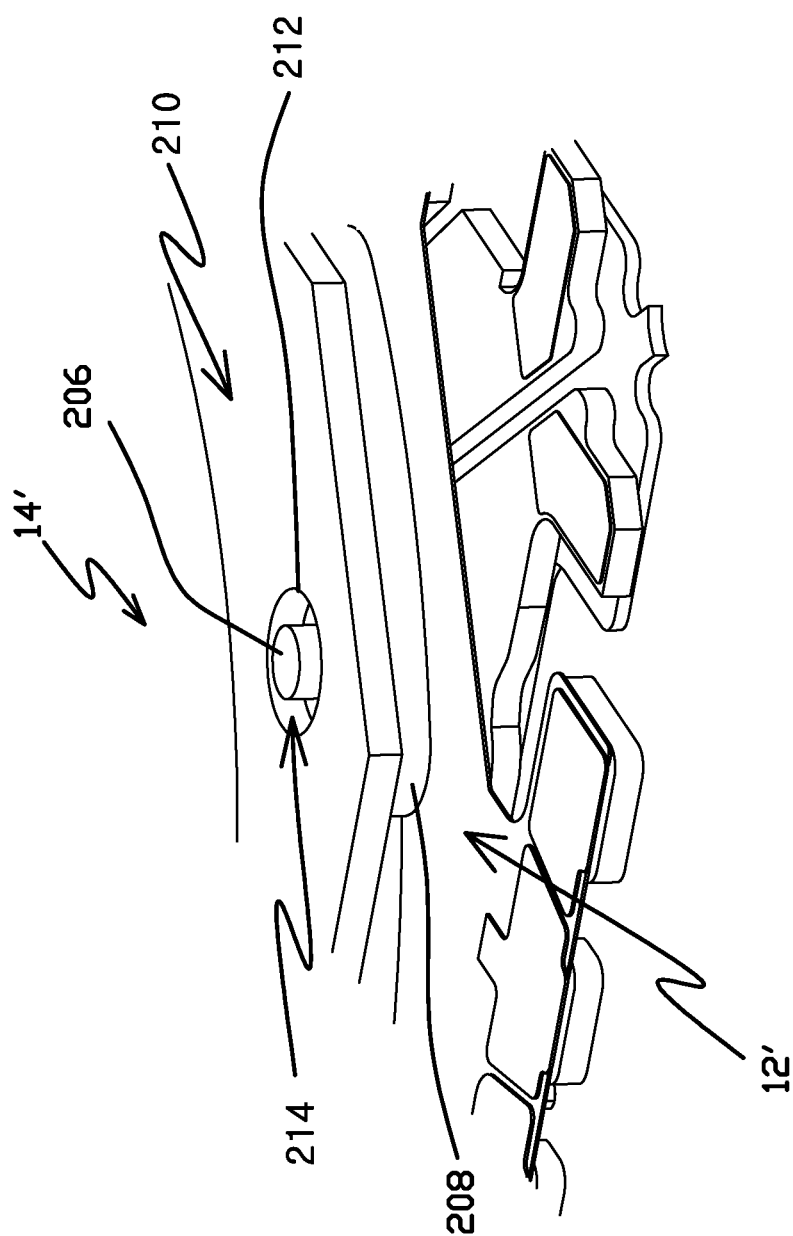
FIG. 29 is a detailed isometric view of a portion of the suspension shown in FIG. 26A, illustrating embodiments of the limiter.
Figure 30:
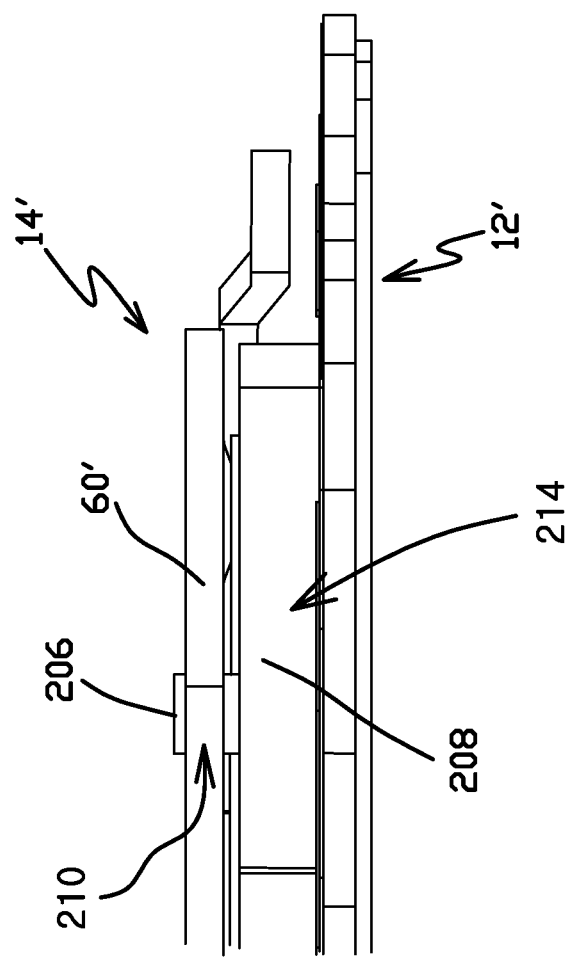
FIG. 30 is a detailed side view of a portion of the suspension shown in FIG. 26A, illustrating embodiments of the limiter.

FIGS. 9-11 illustrate a suspension assembly 110 having bearings 200 in accordance with embodiments of the invention. As shown, suspension assembly 110 includes a can base 111, flexible printed circuit (FPC) or support member 112, bearing race 113, moving member 114 and moving crimp 115. Features of suspension assembly 110 can be similar to those of suspension assembly 10 described above. Support member 112 includes a plurality of wire attach structures such as static crimps 124. Bearing race 113 can be a polymer member and has polymer bearing plate surface portions 203. The bearing race 113 is fixedly attached to can base 111 and/or support member 112 (e.g., by adhesive or welds). Properties of the polymer surface portions 203 (and optionally other portions of the bearing race 113) can include relatively low friction, relatively low viscosity, relatively low wear and/or relatively high stiffness. In one embodiment, bearing race 113 and polymer surface portions 203 are formed from materials such as POM (polyoxymethylene). Bearing race 113 and/or surface portions 203 are formed from other polymers such as fluoropolymers (e.g., Teflon) in other embodiments. As shown in FIG. 11, a screening can 117 can be attached to the can base 111 and enclose portions of the suspension assembly 110.

Moving member 114 includes a plate 160 and spring or flexure arms 162 extending from the plate. Plate 160 and flexure arms 162 are formed from a spring metal layer such as stainless steel. End portions of the flexure arms 162 have mount regions 174 configured to be mounted to mount regions 133 of the support member 112. Moving crimp 115 includes wire attach structures such as crimps 170, and is attached (e.g., by welding) to the plate 160 of moving member 114 to become part of the moving member. Although not shown in FIGS. 9-11, SMA wires are attached to and extend between associated crimps 124 on the support member 112 and crimps 170 on the moving crimp 115.

Bearings 200 include a spacer portion 202 and have a surface region or portion 204. The spacer portion 202 extends from the plate 160 of the moving member 114, and the surface portion 204 engages a polymer surface portion 203 on the bearing race 113 to define a sliding bearing interface that will allow the moving member 114 to slide with respect to the bearing race and the support member 112. Properties of the spacer portion 202 and surface portion 204 can include relatively low friction, relatively low viscosity, relatively low wear and/or relatively high stiffness. In the illustrated embodiment, the spacer portion 202 is a formed dimple in the plate 160. In other embodiments the spacer portion 202 is a separately manufactured member (e.g., from metal, polymer or ceramic) that is attached to the plate 160 (e.g., by adhesive or welding). In embodiments, for example, the spacer portion 202 and surface portion 204 are formed from polyoxymethylene. In embodiments, the surface portion 204 can be a coating on the spacer portion 202. Examples of materials that can be used as coatings for surface portion 204 include ceramic, and polymers such as polyoxymethylene and fluoropolymers (e.g. Teflon). Although three bearings 200 are shown in FIG. 10, other embodiments have fewer or more bearings. Surface portions 203 and/or 204 can be processed, for example by laser polishing or coining, to enhance the smoothness of the surfaces. Bearings 200 offer advantages similar to those of bearings 100 described above.

FIGS. 12-18 are annotated illustrations of an improved camera lens suspension assembly in accordance with embodiments of the invention. The suspension assembly has two primary components—a base or support member (referred to in FIGS. 12-18 as a static FPC (flexible printed circuit)), and a moving/spring member (referred to in the FIGS. 12-18 as a spring crimp circuit). Both the static FPC (base member) and the spring crimp circuit (moving member) are integrated lead structures in the illustrated embodiments, in that they have electrical structures such as leads, contact pads and terminals (e.g. in a copper "Cu" or copper alloy layer) formed on the base metal (stainless steel (SST)) in the illustrated embodiments). A layer of insulator (e.g., polyimide or "poly") separates the portions of the electrical structures that are to be electrically isolated from the SST (other portions of the Cu layer are connected to or directly on the SST layer). At some locations, the electrical structures can be electrically connected to the SST layer by electrical connections (e.g., "vias") extending from the Cu trace or lead layer to the SST layer through openings in the poly layer. In embodiments, a lens can be mounted to the spring crimp circuit. In yet other embodiments, an autofocus system supporting the lens can be mounted to the spring crimp circuit.

As noted above, the static FPC and spring crimp circuit can be formed from overlaying layers of base metal (e.g., a spring metal such as SST), poly and Cu (i.e., the "trace" layer). An insulating covercoat can be applied over all or portions of the Cu. Corrosion resistant metals such as gold (Au) and/or nickel (Ni) can be plated or otherwise applied to portions of the trace layer to provide corrosion resistance. Conventional additive deposition and/or subtractive processes such as wet (e.g., chemical) and dry (e.g., plasma) etching, electro plating and electroless plating and sputtering processes in connection with photolithography (e.g., use of patterned and/or unpatterned photoresist masks), as well as mechanical forming methods (e.g., using punches and forms) can be used to manufacture the static FPC and spring crimp circuit in accordance with embodiments of the invention. Additive and subtractive processes of these types are, for example, known and used in connection with the manufacture of disk drive head suspensions, and are disclosed generally in the following U.S. patents, all of which are incorporated herein by reference for all purposes: Bennin et al. U.S. Pat. No. 8,885,299 entitled Low Resistance Ground Joints for Dual Stage Actuation Disk Drive Suspensions, Rice et al. U.S. Pat. No. 8,169,746 entitled Integrated Lead Suspension with Multiple Trace Configurations, Hentges et al. U.S. Pat. No. 8,144,430 entitled Multi-Layer Ground Plane Structures for Integrated Lead Suspensions, Hentges et al. U.S. Pat. No. 7,929,252 entitled Multi-Layer Ground Plane Structures for Integrated Lead Suspensions, Swanson et al. U.S. Pat. No. 7,388,733 entitled Method for Making Noble Metal Conductive Leads for Suspension Assemblies, Peltoma et al. U.S. Pat. No. 7,384,531 entitled Plated Ground Features for Integrated Lead Suspensions.

The static FPC is a one-piece member in the illustrated embodiment, and has two static crimps (attachment structures) on each of two diagonal corners of the member (4 static crimps in total). A terminal pad section includes terminal pads in the trace layer that are connected to traces that extend over the surface of the member. As shown for example, a separate trace extends to each of the four static crimps. At each of the static crimps is an electrical contact or terminal formed by the trace and poly layers. Formed dimples extending from the upper surface of the static FPC member engage the back surface of the spring crimp circuit member, and function as sliding interface bearings to enable low friction movement of the spring crimp circuit member with respect to the static FPC. The traces on the static FPC also couple terminal pads to electrical pad locations on the static FPC that are electrically and mechanically coupled to the spring crimp circuit member (e.g., to provide electrical signals to an auto focus (AF) assembly and to provide a common or ground signal path to the SST layer of the spring crimp circuit member. Vias couple the respective traces on the static FPC to portions of the SST layer that are connected to the feet.

The spring crimp circuit is a one-piece member in the illustrated embodiments and includes a central member for supporting a lens or auto focus system, and one or more spring arms (two in the illustrated embodiment) extending from the central member. The spring crimp member has two moving crimps on each of two diagonal corners of the member (4 moving crimps in all). Pedestals or feet in the SST layer (on the ends of the spring arms opposite the central member in the illustrated embodiment) are configured to be welded or otherwise attached to corresponding locations on the static FPC. Traces on the spring crimp member are configured to be electrically coupled to traces on the static FPC (e.g., through the feet) and couple signals to terminal pads such as the auto focus (AF) terminal pads. In the illustrated embodiment, the SST layer of the spring crimp circuit is used as a signal path to the ends of the SMA wires attached to the moving crimps. Electrical connection between the corresponding terminal pad and trace on the static FPC to the SST layer of the spring crimp circuit is provided by the connection between the feet of the spring arms and the SST layer of the static FPC (i.e., the SST layers of the two members are electrically coupled, and are at a common ground potential in embodiments).

Suspensions in accordance with the invention having traces on the moving member flexure arms offer important advantages. They can for example, be efficiently fabricated and assembled. The traces are effective structures for coupling electrical signals to structures mounted to the plate or other portions of the moving member.

FIGS. 26A, 26B, 27, 28A, 28B and 29-30 illustrate a suspension assembly 10' that includes a crash stop or limiter 210 in accordance with embodiments of the invention. Other than the limiter 210, features of suspension 10' can be similar to or the same as other embodiments of the invention, including suspension 10 described above. Limiter 210 can also be incorporated in any or all other described embodiments of the invention.

As shown, the limiter 210 includes an engaged structure such as opening 212 on or in the plate 60' of the moving member 14', and a stop 214 on the support member 12' (e.g., on a planar portion of the support member). An engagement portion 206 of the stop 214 is fixedly positioned with respect to the support member 12' and extends into the opening 212. A first diameter of the opening 212 is greater than a second diameter of the engagement portion 206, allowing a limited range of motion of the moving member 14' with respect to the support member 12' (e.g., in directions generally parallel to the major planar surfaces of the moving member and support member). Features of limiter 210 such as the shapes, sizes and locations of the opening 212 and stop 214 are configured to prevent displacement of the moving member 14' with respect to the support member 12' that might cause damage to the suspension 10' components or other components, such as a lens, mounted to the suspension. The engagement portion 206 can move within a predetermined range of movement, but engages the engaged structure such as the wall portions of the plate 60' defining the opening 212 to limit the range of relative movement.

In embodiments, the engagement portion 206 is on a spacer portion 208. The spacer portion 208, which can be integral with and/or formed from the same material as the engagement portion 206, is larger than the engagement portion in embodiments, and provides a base for the engagement portion to extend or otherwise position the engagement portion away from the major planar surface of the support member 12'. The engagement portion 206 is on an end of the spacer portion 208 opposite the major planar surface of the support member 12'. In embodiments, the stop 214 can be a separately manufactured polymer member that is attached to the support member 12' (e.g., by adhesive). In other embodiments the stop 214 can be a metal member formed from one or more layers of the support member 12' (e.g., from the base layer 16'), or a separately manufactured member that is attached to the support member during assembly (e.g., by welding). In still other embodiments the stop 214 can be integral with other suspension components such as the bearing such as that shown at 100. Although two limiters 210 are shown in the illustrated embodiment, other embodiments have more or fewer limiters. Opening 212 can be a through hole as shown in the illustrated embodiment, or a recess or pocket (e.g., formed by partial etching). In still other embodiments the opening 212 can be on the support member 12' and the stop 214 can be on the moving member 14'. Limiters such as 210 provide important advantages. For example, they can prevent damage to the suspension or components mounted thereto (e.g., when the device in which it is incorporated is dropped). Suspensions including the limiters can also be efficiently manufactured.

In embodiments, the suspension assembly comprises: (1) a support member including a wire attach structure; (2) a moving member coupled to the support member, including: (i) a plate; (ii) flexure arms extending from the plate and coupled to the support member; and (iii) a wire attach structure; (3) a bearing supporting the plate of the moving member for movement with respect to the support member; (4) a shape memory alloy wire coupled to and extending between the wire attach structures of the support member and the moving member; and (5) a limiter to limit a range of movement of the moving member with respect to the support member, the limiter including: (i) an opening in one of the moving member plate and the support member, wherein the opening has a first diameter; and (ii) a stop on the other of the moving member plate and the support member, the stop including an engagement portion extending into the opening, wherein the engagement portion has a second diameter that is less than the first diameter. In embodiments, the stop further includes a spacer portion, and wherein the engagement portion is on an end of the spacer portion. In embodiments, the spacer portion is formed from the support member. In embodiments, the spacer portion is formed as a member separate from the support member, and is mounted to the support member. In embodiments, the opening is a through hole in the plate of the moving member.

Although the invention has been described with reference to preferred embodiments, those of skill in the art will recognize that changes can be made in form and detail without departing from the spirit and scope of the invention. For example, although the illustrated embodiments include the traces on the sides of the flexure arms opposite the support member (i.e., on the top side of the traces), other embodiments can alternatively or in addition include traces on the sides of the flexure arms facing the moving member (i.e., on the bottom side of the traces). Although described in connection with certain suspension assembly embodiments, bearings 200 and 100 can be incorporated in other suspension assembly embodiments. Bearings in accordance with embodiments of the invention can be used in combination, and/or in connection with or as an alternative to ball bearings to provide for relative movement between suspension components. Features of bearings 100 and 200 can be combined with each other.

What is claimed is:

1. A suspension assembly, comprising:
a support member including a bearing race;
a moving member including a plate and flexure arms extending from the plate and coupled to the support member;
at least one bearing mounted to and extending from the moving member to slidably engage the support member, the bearing including a spacer portion mounted to and extending from the plate of the moving member and a polymer interface surface portion slidably engaged with the bearing race of the support member to define a sliding bearing interface that will enable the moving member to move with respect to the bearing race and the support member.

2. The suspension assembly of claim 1, wherein the support member includes a wire attach structure.

3. The suspension assembly of claim 2, wherein the moving member includes a wire attach structure.

4. The suspension assembly of claim 3, comprising a shape memory alloy wire coupled to and extending between the wire attach structures of the support member and the moving member.

5. The suspension assembly of claim 1, wherein the polymer interface surface portion of the at least one bearing includes one of polyoxymethylene and fluoropolymers.

6. The suspension assembly of claim 1, wherein the spacer portion of the at least one bearing is made up of metal.

7. The suspension assembly of claim 1, wherein:
the plate of the moving member is metal; and
the spacer portions of the bearings include formed dimples in the metal of the moving member plate.

8. The suspension assembly of claim 1, wherein:
the moving member includes a metal base layer; and
the spacer portion is attached to and extends from the metal base layer of the moving member.

9. The suspension assembly of claim 8, wherein the spacer portion is made up of polymer.

10. The suspension assembly of claim 9, and further including adhesive joining the polymer spacer portion to the metal base layer of the moving member.

11. The suspension assembly of claim 1, further including a can base and a screening can attached to the can base and enclose the support member, the moving member, and the at least one bearing.

12. A suspension assembly, comprising:
a support member including a bearing race and a wire attachment structure;
a moving member including a plate, a wire attachment structure, and flexure arms extending from the plate and coupled to the support member;
at least one bearing mounted to and supporting the plate of the moving member for movement with respect to the support member, the at least one bearing including a spacer portion extending from the moving member, and a polymer interface surface portion slidably engaged with the bearing race of the support member to define a sliding bearing interface that will enable the moving member to move with respect to the bearing race and the support member; and
a shape memory alloy wire coupled to and extending between the support member and the moving member.

13. The suspension assembly of claim 12, wherein the shape memory alloy wire is coupled to and extending between the wire attach structures of the support member and the moving member.

14. The suspension assembly of claim 12, wherein the polymer interface surface portion includes one of polyoxymethylene and fluoropolymers.

15. The suspension assembly of claim 12, wherein the spacer portion of the at least one bearing is made up of metal.

16. The suspension assembly of claim 12, wherein:
the plate of the moving member is made up of metal; and
the spacer portion extending from the moving member includes dimples in the plate of the moving member.

17. The suspension assembly of claim 12, wherein:
the moving member includes a metal base layer; and
the spacer portion is attached to and extends from the metal base layer of the moving member.

18. The suspension assembly of claim 17, wherein the spacer portion is made up of polymer.

19. The suspension assembly of claim 18, and further including adhesive joining the polymer spacer portion to the metal base layer of the moving member.

20. The suspension assembly of claim 12, further including a can base and a screening can attached to the can base and enclose the support member, the moving member, and the at least one bearing.

* * * * *